(12) United States Patent
Liu et al.

(10) Patent No.: US 10,790,799 B2
(45) Date of Patent: Sep. 29, 2020

(54) PIEZOELECTRIC THIN FILM RESONATOR, FILTER, AND MULTIPLEXER

(71) Applicant: TAIYO YUDEN CO., LTD., Tokyo (JP)

(72) Inventors: Jiansong Liu, Tokyo (JP); Tokihiro Nishihara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 110 days.

(21) Appl. No.: 15/917,474

(22) Filed: Mar. 9, 2018

(65) Prior Publication Data
US 2018/0294794 A1    Oct. 11, 2018

(30) Foreign Application Priority Data
Apr. 7, 2017 (JP) .................. 2017-076932

(51) Int. Cl.
*H03H 9/17* (2006.01)
*H03H 3/02* (2006.01)
(Continued)

(52) U.S. Cl.
CPC .............. *H03H 9/175* (2013.01); *H03H 3/02* (2013.01); *H03H 9/02118* (2013.01);
(Continued)

(58) Field of Classification Search
CPC .. H03H 9/02118; H03H 3/02; H03H 9/02015; H03H 9/02031; H03H 9/131; H03H 9/173; H03H 9/175; H03H 9/178; H03H 9/562; H03H 9/564; H03H 9/568; H03H 9/706; H03H 2003/021; H03H 2003/025
(Continued)

(56) References Cited

U.S. PATENT DOCUMENTS

| 6,812,619 B1 | 11/2004 | Kaitila et al. |
| 9,048,812 B2 | 6/2015 | Burak et al. |

(Continued)

FOREIGN PATENT DOCUMENTS

| GB | 2 418 791 A | 4/2006 |
| JP | 2002-223144 A | 8/2002 |

(Continued)

*Primary Examiner* — Benny T Lee
*Assistant Examiner* — Hafizur Rahman
(74) *Attorney, Agent, or Firm* — Chen Yoshimura LLP

(57) ABSTRACT

A piezoelectric thin film resonator includes: a substrate; a piezoelectric film located on the substrate; lower and upper electrodes facing each other across the piezoelectric film; a mass load film that is located at least one of a first side, which is closer to the upper electrode, of the piezoelectric film and a second side, which is closer to the lower electrode, of the piezoelectric film, separated from the upper and lower electrodes, and surrounds in plan view a resonance region at least in part, the lower and upper electrodes facing each other across the piezoelectric film in the resonance region; and an acoustic reflection layer that includes the resonance region and the mass load film in plan view, is located in or on the substrate, and includes an air gap or an acoustic mirror in which at least two layers with different acoustic characteristics are stacked.

18 Claims, 22 Drawing Sheets

(51) Int. Cl.
  *H03H 9/70* (2006.01)
  *H03H 9/13* (2006.01)
  *H03H 9/54* (2006.01)
  *H03H 9/02* (2006.01)

(52) U.S. Cl.
  CPC .............. *H03H 9/13* (2013.01); *H03H 9/173* (2013.01); *H03H 9/54* (2013.01); *H03H 9/70* (2013.01); *H03H 2003/021* (2013.01); *H03H 2003/025* (2013.01)

(58) Field of Classification Search
  USPC ........................................................ 333/133
  See application file for complete search history.

(56) References Cited

U.S. PATENT DOCUMENTS

| | | |
|---|---|---|
| 2002/0079986 A1 | 6/2002 | Ruby et al. |
| 2004/0056735 A1 | 3/2004 | Nomura et al. |
| 2004/0195937 A1 | 10/2004 | Matsubara et al. |
| 2008/0179995 A1 | 7/2008 | Umeda et al. |
| 2014/0111288 A1* | 4/2014 | Nikkel ............... H03H 9/02118 333/187 |
| 2014/0210570 A1 | 7/2014 | Nishihara et al. |
| 2016/0353221 A1 | 12/2016 | Okamura et al. |
| 2017/0170809 A1 | 6/2017 | Yokoyama et al. |
| 2017/0338399 A1* | 11/2017 | Kim ........................ H01L 41/27 |

FOREIGN PATENT DOCUMENTS

| | | |
|---|---|---|
| JP | 2003-505906 A | 2/2003 |
| JP | 2004-120219 A | 4/2004 |
| JP | 2004-304704 A | 10/2004 |
| JP | 2006-109472 A | 4/2006 |
| JP | 2007-243521 A | 9/2007 |
| JP | 2014-161001 A | 9/2014 |
| JP | 2016-225746 A | 12/2016 |
| JP | 2017-112437 A | 6/2017 |
| WO | 2007/052370 A1 | 5/2007 |

* cited by examiner

FIG. 14

| SAMPLE | Qa AT ANTIRESONANT FREQUENCY | $K^2$ [%] | INTENSITY OF SPURIOUS [dB] |
|---|---|---|---|
| A | 1569 | 6.84 | 1.86 |
| B | 1957 | 7.25 | 1.65 |
| C | 2343 | 7.25 | 0.43 |
| D | 785 | 7.25 | 1.02 |
| E | 946 | 7.25 | 0.41 |

1.95GHz TO 2.15GHz

2GHz TO 2.2GHz

FIG. 18B FIRST MODE

FIG. 18C SECOND MODE

FIG. 18D THIRD MODE

FIG. 18E FOURTH MODE

FIRST MODE

SECOND MODE

THIRD MODE

FOURTH MODE

US 10,790,799 B2

PIEZOELECTRIC THIN FILM RESONATOR, FILTER, AND MULTIPLEXER

CROSS-REFERENCE TO RELATED APPLICATION

This application is based upon and claims the benefit of priority of the prior Japanese Patent Application No. 2017-076932, filed on Apr. 7, 2017, the entire contents of which are incorporated herein by reference.

FIELD

A certain aspect of the present invention relates to a piezoelectric thin film resonator, a filter, and a multiplexer.

BACKGROUND

Acoustic wave devices including piezoelectric thin film resonators have been used as filters and multiplexers of wireless devices such as, for example, mobile phones. The piezoelectric thin film resonator has a multilayered film in which a lower electrode and an upper electrode face each other across a piezoelectric film. The region where the lower electrode and the upper electrode face each other across the piezoelectric film is the resonance region.

The rapid diffusion of wireless systems has promoted the use of many frequency bands. As a result, the filters and the duplexers have been desired to have steeper skirt characteristics. One way of steepening skirt characteristics is to increase the Q-value of the piezoelectric thin film resonator.

There has been known a piezoelectric thin film resonator including an annulus on a surface of one of the upper electrode and the lower electrode as disclosed in, for example, Japanese Patent Application Publication No. 2006-109472 (Patent Document 1). There has been also known a piezoelectric thin film resonator including an insertion film inserted in the piezoelectric film in the outer peripheral region of the resonance region as disclosed in, for example, Japanese Patent Application Publication No. 2014-161001 (Patent Document 2). There has been known a piezoelectric thin film resonator including an annulus called a bridge in the piezoelectric film as disclosed in, for example, U.S. Pat. No. 9,048,812 (Patent Document 3). It has been known that spurious can be reduced by operating a piezoelectric thin film resonator in a piston mode as disclosed in, for example, Japanese Patent Application Publication No. 2003-505906.

SUMMARY OF THE INVENTION

According to the first aspect of the present invention, there is provided a piezoelectric thin film resonator including: a substrate; a piezoelectric film located on the substrate; a lower electrode and an upper electrode facing each other across at least a part of the piezoelectric film; a mass load film that is located at least one of a first side, which is closer to the upper electrode, of the piezoelectric film and a second side, which is closer to the lower electrode, of the piezoelectric film, is separated from the upper electrode and the lower electrode, and surrounds in plan view a resonance region at least in part, the lower electrode and the upper electrode facing each other across the piezoelectric film in the resonance region; and an acoustic reflection layer that includes the resonance region and the mass load film in plan view, is located in or on the substrate, and includes an air gap or an acoustic mirror in which at least two layers with different acoustic characteristics are stacked.

According to the second aspect of the present invention, there is provided a filter including the above piezoelectric thin film resonator.

According to the third aspect of the present invention, there is provided a multiplexer including the above filter.

BRIEF DESCRIPTION OF THE DRAWINGS

FIG. 14 presents the Q-value at the antiresonant frequency, the electromechanical coupling coefficient, and the intensity of spurious in each of the samples A through E;

FIG. 18B through FIG. 18E illustrate electrical signals of first-mode through fourth-mode standing waves of the lateral mode acoustic wave, respectively;

DETAILED DESCRIPTION

The techniques disclosed in Patent Documents 1 through 3 can reduce the leak of the acoustic wave energy from the resonance region, thereby improving the Q-value. However, the leak of the acoustic wave energy from the resonance region is not sufficiently reduced.

Hereinafter, a description will be given of embodiments of the present invention with reference to the accompanying drawings.

First Embodiment

Figure 1A:
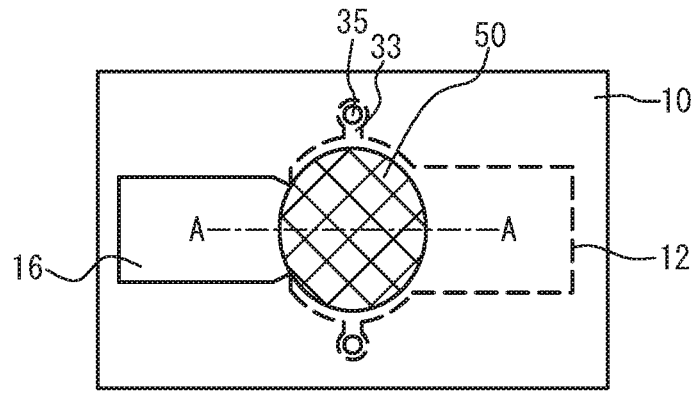
FIG. 1A is a plan view of a piezoelectric thin film resonator in accordance with a first embodiment.
Figure 1B:
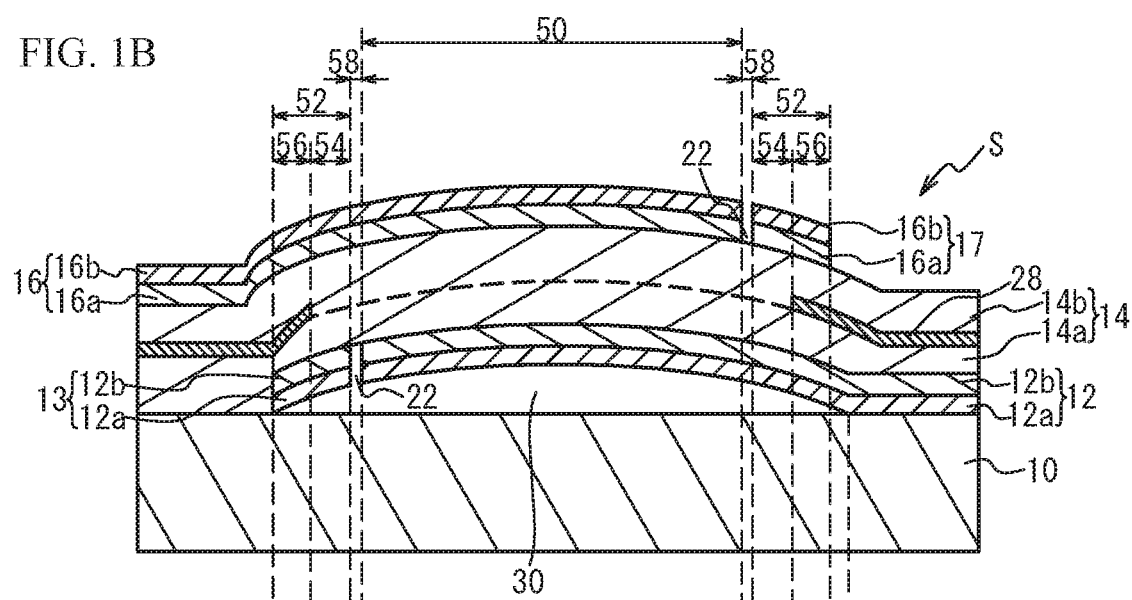
FIG. 1B and FIG. 1C are cross-sectional views taken along line A-A in FIG. 1A.
Figure 1C:
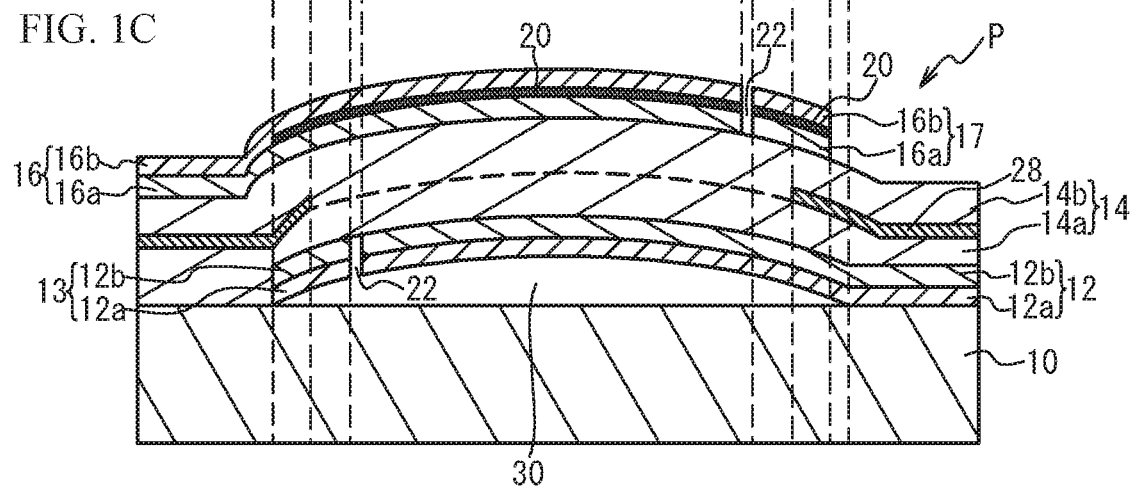

FIG. 1A is a plan view of a piezoelectric thin film resonator in accordance with a first embodiment, and FIG. 1B and FIG. 1C are cross-sectional views taken along line A-A in FIG. 1A. FIG. 1A mainly illustrates a lower electrode 12 and an upper electrode 16. FIG. 1B illustrates, for example, a series resonator of a ladder-type filter, and FIG. 1C illustrates, for example, a parallel resonator of the ladder-type filter.

With reference to FIG. 1A and FIG. 1B, the structure of a series resonator S will be described. The lower electrode 12 and a lower additional film 13 are located on a substrate 10 that is a silicon (Si) substrate. The lower electrode 12 and the lower additional film 13 are located away across an air layer 22 from one another, and electrically separated. The lower additional film 13 is electrically floating. Each of the lower electrode 12 and the lower additional film 13 includes a lower layer 12a and an upper layer 12b. The lower layer 12a is made of, for example, a chrome (Cr) film, and the upper layer 12b is made of, for example, a ruthenium (Ru) film.

An air gap 30 having a dome-shaped bulge is formed between the flat principal surface of the substrate 10 and the lower electrode 12 and the lower additional film 13. The dome-shaped bulge is a bulge having a shape in which the height is low in the periphery of the air gap 30, and increases at closer distances to the center of the air gap 30, for example.

Located on the lower electrode 12 is a piezoelectric film 14 mainly composed of aluminum nitride (AlN) having the (002) direction as the main axis. The piezoelectric film 14 includes a lower piezoelectric film 14a and an upper piezoelectric film 14b. An insertion film 28 is located between the lower piezoelectric film 14a and the upper piezoelectric film 14b.

Located on the piezoelectric film 14 are the upper electrode 16 and an upper additional film 17. The upper electrode 16 and the upper additional film 17 are located away across the air layer 22 from one another, and are electrically separated. The upper additional film 17 is electrically floating. Each of the upper electrode 16 and the upper additional film 17 includes a lower layer 16a and an upper layer 16b. The lower layer 16a is made of, for example, a Ru film, and the upper layer 16b is made of, for example, a Cr film. The region where the lower electrode 12 and the upper electrode 16 face each other across at least a part of the piezoelectric film 14 is a resonance region 50. The resonance region 50 is a region that has an elliptical shape, and in which the acoustic wave in the thickness extension mode resonates.

An additional film region 52 having the lower additional film 13 or the upper additional film 17 formed therein is located away across a separation region 58 from the resonance region 50.

The insertion film 28 is located in at least a part of the region surrounding the resonance region 50, and is not located within the resonance region 50. The region closer to the resonance region 50 (i.e., the inner region) of the additional film region 52 is a non-insertion region 54 having no insertion film 28 formed therein, and the region opposite from the resonance region 50 (i.e., the outer region) is an insertion region 56 having the insertion film 28 formed therein.

The multilayered film in the resonance region 50 includes the lower electrode 12, the piezoelectric film 14, and the upper electrode 16. The multilayered film may include a frequency adjusting film and/or a passivation film such as a silicon oxide film formed on the upper electrode 16.

As illustrated in FIG. 1A, an introduction path 33 for etching a sacrifice layer is formed in the lower electrode 12. The sacrifice layer is a layer for forming the air gap 30. The vicinities of the ends of the introduction path 33 are not covered with the piezoelectric film 14, and the lower electrode 12 has hole portions 35 at the ends of the introduction path 33.

With reference to FIG. 1C, the structure of a parallel resonator P will be described. The parallel resonator P differs from the series resonator S in that a frequency control film 20 made of a titanium (Ti) layer is located between the lower layer 16a and the upper layer 16b of the upper electrode 16. Accordingly, the multilayered film includes the frequency control film 20 formed across the entire surface in the resonance region 50 in addition to the multilayered film of the series resonator S. The difference in resonant frequency between the series resonator S and the parallel resonator P is adjusted by using the film thickness of the frequency control film 20. Other structures are the same as those of the series resonator S in FIG. 1B, and the description thereof is thus omitted.

The piezoelectric thin film resonator having a resonant frequency of 2 GHz is configured as follows, for example. The lower layer 12a of the lower electrode 12 is made of a Cr film with a film thickness of 100 nm, and the upper layer 12b is made of a Ru film with a film thickness of 200 nm. The piezoelectric film 14 is an AlN film with a film thickness of 1200 nm. The insertion film 28 is a silicon oxide ($SiO_2$) film with a film thickness of 150 nm. The insertion film 28 is located in the middle in the film thickness direction of the piezoelectric film 14. The lower layer 16a of the upper electrode 16 is formed of a Ru film with a film thickness of 230 nm, and the upper layer 16b is formed of a Cr film with a film thickness of 50 nm. The frequency adjusting film and/or the passivation film is a silicon oxide film with a film thickness of 50 nm. The frequency control film 20 is a Ti film with a film thickness of 120 nm. The film thickness of each layer is appropriately configured to achieve desired resonance characteristics.

As described in Patent Document 2, the Young's modulus of the insertion film 28 is preferably less than that of the piezoelectric film 14. When the density is approximately the same, Young's modulus correlates with acoustic impedance. Thus, the insertion film 28 preferably has acoustic impedance less than that of the piezoelectric film 14. This configuration improves the Q-value. Further, to make the acoustic impedance of the insertion film 28 less than the acoustic impedance of the piezoelectric film 14, when the piezoelectric film 14 is mainly composed of aluminum nitride, the insertion film 28 is preferably an aluminum (Al) film, a gold (Au) film, a copper (Cu) film, a Ti film, a platinum (Pt) film, a tantalum (Ta) film, a Cr film, or a silicon oxide film. Especially in the light of the Young's modulus, the insertion film 28 is preferably an Al film or a silicon oxide film.

The substrate 10 may be, instead of a Si substrate, a sapphire substrate, an alumina substrate, a spinel substrate, a quartz substrate, a glass substrate, a ceramic substrate, or a GaAs substrate. The lower electrode 12 and the upper electrode 16 may be formed of a single-layer film of Al, Ti, Cu, molybdenum (Mo), tungsten (W), Ta, Pt, rhodium (Rh), or iridium (Ir), or a multilayered film of at least two of them, instead of Ru and Cr. For example, the lower layer 16a of the upper electrode 16 may be made of Ru, and the upper layer 16b may be made of Mo.

The piezoelectric film 14 may be made of, instead of aluminum nitride, zinc oxide (ZnO), lead zirconate titanate (PZT), or lead titanate (PbTiO$_3$). Alternatively, for example, the piezoelectric film 14 may be mainly composed of aluminum nitride, and contain another element for improving the resonance characteristics or the piezoelectricity. For example, the use of scandium (Sc), a Group II element or a Group XII element and a Group IV element, or a Group II element or a Group XII element and a Group V element as additive elements improves the piezoelectricity of the piezoelectric film 14. Accordingly, the effective electromechanical coupling coefficient of the piezoelectric thin film resonator is improved. The Group II element or the Group XII element is, for example, calcium (Ca), magnesium (Mg), strontium (Sr), or zinc (Zn). The Group IV element is, for example, Ti, zirconium (Zr), or hafnium (Hf). The Group V element is, for example, Ta, niobium (Nb), or vanadium (V). Yet alternatively, the piezoelectric film 14 may mainly composed of aluminum nitride, and contain boron (B).

The frequency adjusting film and/or the passivation film may be, instead of a silicon oxide film, a silicon nitride film or an aluminum nitride. The frequency control film 20 may be a single-layer film of Ru, Cr, Al, Cu, Mo, W, Ta, Pt, Rh, or Ir instead of Ti. Alternatively, for example, an insulating film made of nitride such as silicon nitride or oxide such as silicon oxide may be used. The frequency control film 20 may be formed under the lower electrode 12, between the layers of the lower electrode 12, on the upper electrode 16, between the lower electrode 12 and the piezoelectric film 14, or between the piezoelectric film 14 and the upper electrode 16 instead of between the layers (the lower layer 16a and the upper layer 16b) of the upper electrode 16. The frequency control film 20 may be larger than the resonance region 50 as long as the frequency control film 20 is formed so as to include the resonance region 50.

The lower additional film 13 and the upper additional film 17 are preferably films made of the same material and having the same film thickness as those of the lower electrode 12 and the upper electrode 16, respectively. The lower additional film 13 and the upper additional film 17 may be single-layer films of Al, Ti, Cu, Mo, W, Ta, Pt, Rh, or Ir or multilayered films of at least two of them instead of Ru and Cr. The lower additional film 13 and the upper additional film 17 may be, for example, insulating films made of nitride such as silicon nitride or oxide such as silicon oxide.

Figure 2A:
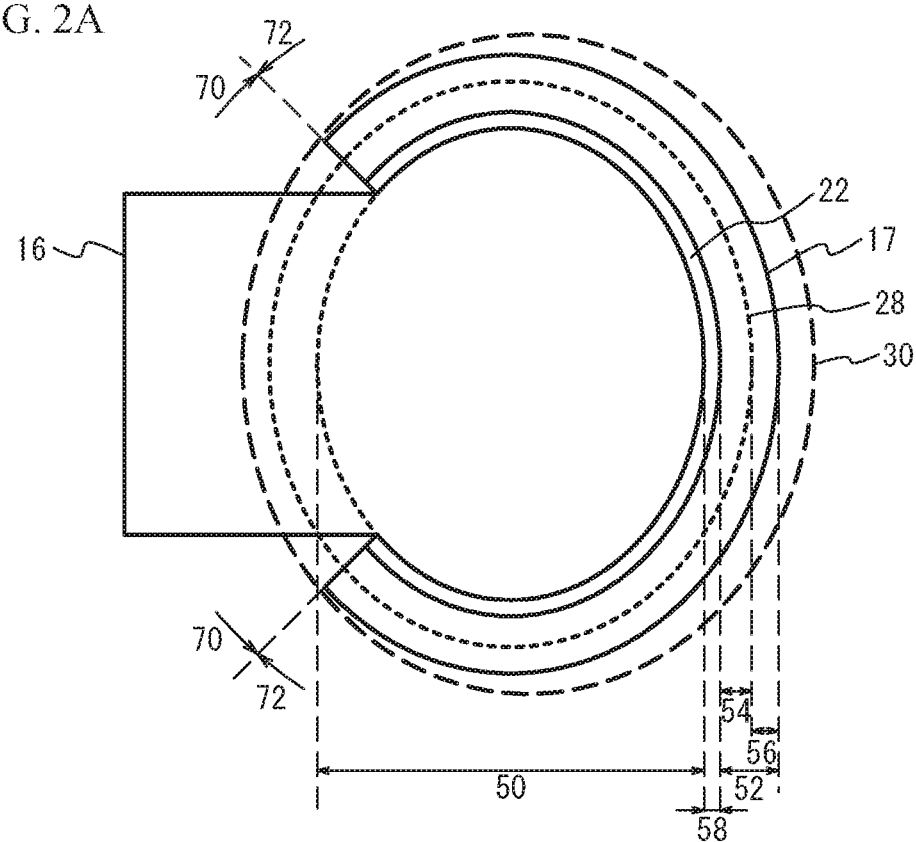
FIG. 2A is a plan view illustrating a positional relation among an upper electrode, an upper additional film, an insertion film, and an air gap near a resonance region in the first embodiment.
Figure 2B:
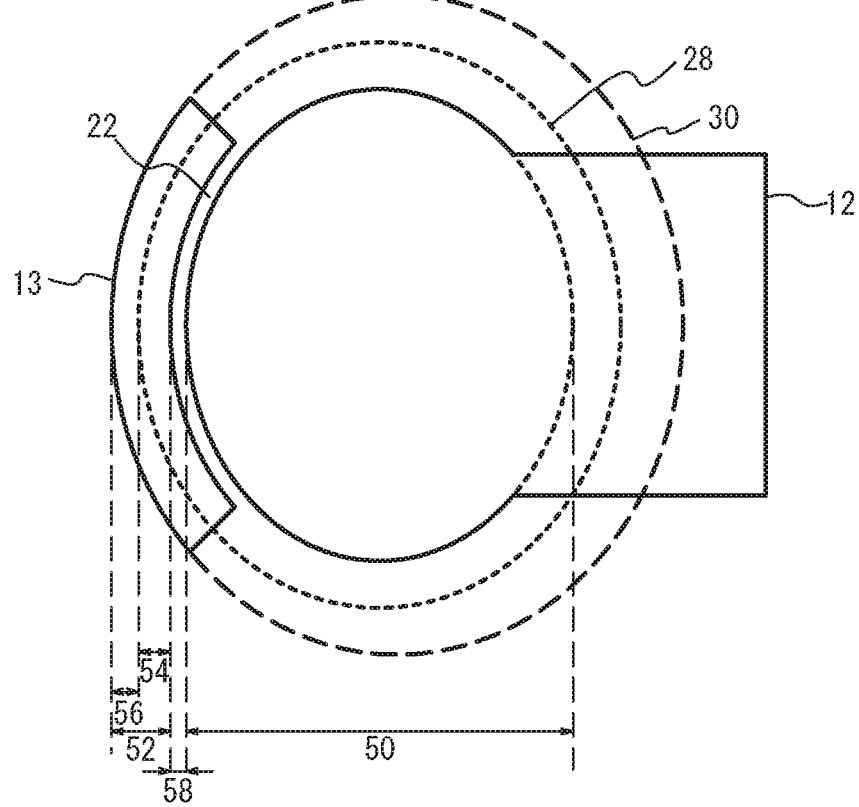
FIG. 2B is a plan view illustrating a positional relation among a lower electrode, a lower additional film, an insertion film, and the air gap.

FIG. 2A is a plan view illustrating a positional relation among the upper electrode, the upper additional film, the insertion film, and the air gap near the resonance region in the first embodiment, and FIG. 2B is a plan view illustrating a positional relation among the lower electrode, the lower additional film, the insertion film, and the air gap.

As illustrated in FIG. 2A, in the region surrounding the resonance region 50, the region where the upper electrode 16 is extracted from the resonance region 50 is an extraction region 70, and the region other than the extraction region 70 of the region surrounding the resonance region 50 is a region 72. In the region 72, the outline of the upper electrode 16 is aligned with the outline of the resonance region 50. In the region 72, the upper additional film 17 is provided so as to surround the resonance region 50 (i.e., the upper electrode 16). The region between the upper additional film 17 and the resonance region 50 is the separation region 58. The insertion film 28 is not located within the resonance region 50, and is provided so as to surround the resonance region 50. The inner outline of the insertion film 28 is located in the additional film region 52 having the upper additional film 17 formed therein. The insertion region 56 having the insertion film 28 formed therein is located outside the non-insertion region 54 having no insertion film 28 formed therein in the additional film region 52. The air gap 30 is provided so as to be larger than the resonance region 50 and the additional film region 52 and include the resonance region 50 and the additional film region 52 in plan view.

As illustrated in FIG. 2B, in the extraction region 70, the outline of the lower electrode 12 is aligned with the outline of the resonance region 50. In the extraction region 70, the lower additional film 13 is provided so as to surround the resonance region 50 (i.e., the lower electrode 12). The region between the lower additional film 13 and the resonance region 50 is the separation region 58. The inner outline of the insertion film 28 is located in the additional film region 52. The insertion region 56 is located outside the non-insertion region 54 in the additional film region 52. The air gap 30 is provided so as to be larger than the resonance region 50 and the additional film region 52 and include the resonance region 50 and the additional film region 52 in plan view. As described above, the lower additional film 13 and the upper additional film 17 are provided so as to surround substantially the complete periphery of the resonance region 50. The insertion film 28 is also provided so as to surround substantially the complete periphery of the resonance region 50.

Figure 3A:
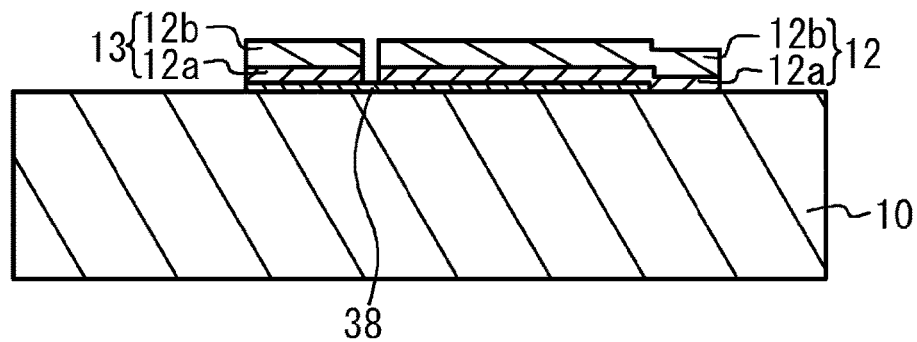
FIG. 3A through FIG. 3C are cross-sectional views illustrating a method of fabricating the piezoelectric thin film resonator in accordance with the first embodiment.
Figure 3B:
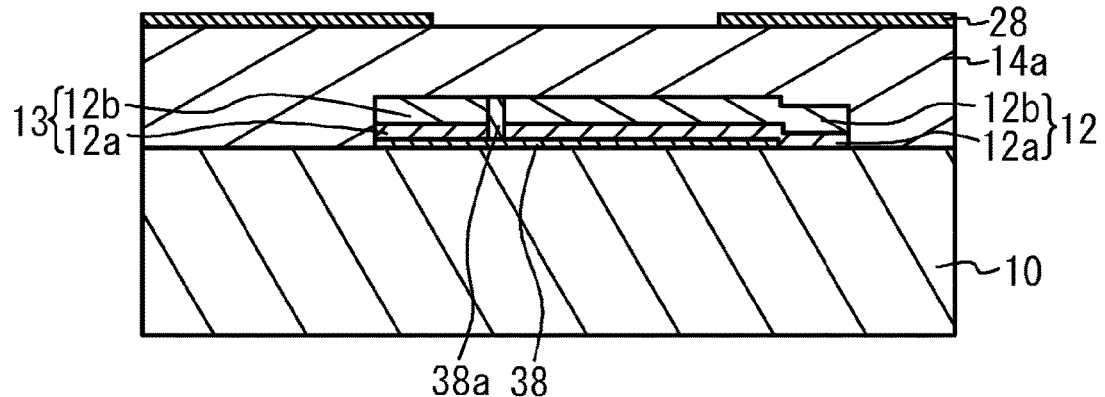
Figure 3C:
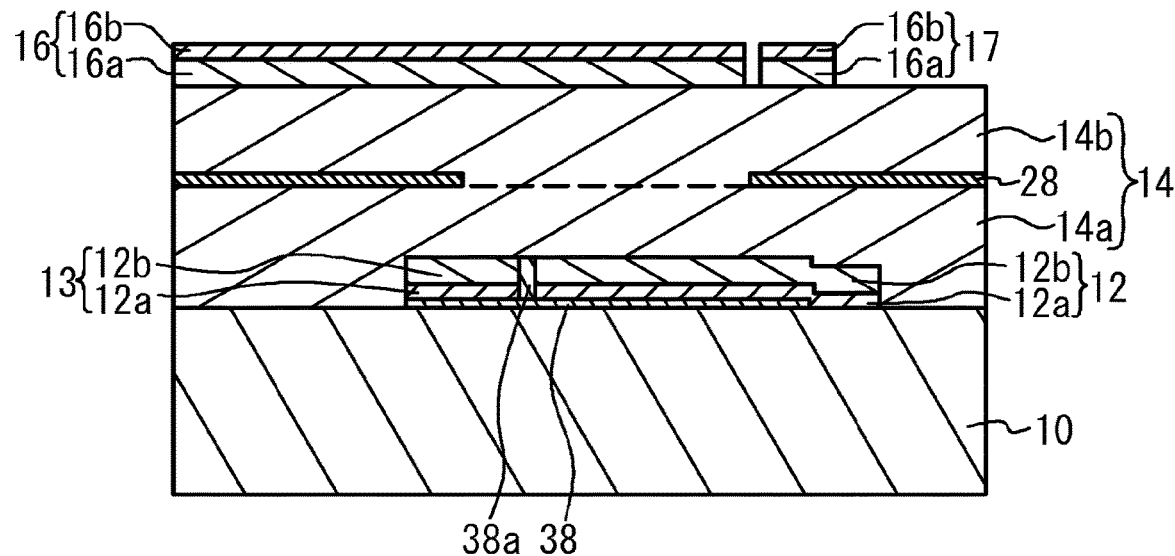

FIG. 3A through FIG. 3C are cross-sectional views illustrating a method of fabricating the piezoelectric thin film resonator in accordance with the first embodiment. As illustrated in FIG. 3A, a sacrifice layer 38 for forming the air gap is formed on the substrate 10 having a flat principal surface. The sacrifice layer 38 has a film thickness of, for example, 10 to 100 nm, and is made of a material selected from materials such as magnesium oxide (MgO), ZnO, germanium (Ge) and silicon oxide (SiO$_2$), which easily dissolve in an etching liquid or an etching gas. Thereafter, the sacrifice layer 38 is patterned into a desired shape by photolithography and etching. The shape of the sacrifice layer 38 corresponds to the shape of the air gap 30, and includes, for example, the region to be the resonance region 50. Then, the lower layer 12a and the upper layer 12b are formed on the sacrifice layer 38 and the substrate 10. The sacrifice layer 38 and the lower electrode 12 are formed by, for example, sputtering, vacuum evaporation, or Chemical Vapor Deposition (CVD). Then, the lower layer 12a and the upper layer 12b are patterned into desired shapes by photolithography and etching to form the lower electrode 12 and the lower additional film 13. The lower electrode 12 and the lower additional film 13 may be formed by liftoff.

As illustrated in FIG. 3B, a sacrifice layer 38a is formed between the lower electrode 12 and the lower additional film 13. The sacrifice layer 38a is made of the same material as the sacrifice layer 38. The lower piezoelectric film 14a is formed on the lower electrode 12, the lower additional film 13, the sacrifice layer 38a, and the substrate 10 by, for example, sputtering, vacuum evaporation, or CVD. The insertion film 28 is formed on the lower piezoelectric film 14a by, for example, sputtering, vacuum evaporation, or CVD. The insertion film 28 is patterned into a desired shape by photolithography and etching. The insertion film 28 may be formed by liftoff.

As illustrated in FIG. 3C, the upper piezoelectric film 14b is formed on the lower piezoelectric film 14a and the insertion film 28 by, for example, sputtering, vacuum evaporation, or CVD. The lower piezoelectric film 14a and the upper piezoelectric film 14b form the piezoelectric film 14. The lower layer 16a and the upper layer 16b are formed by, for example, sputtering, vacuum evaporation, or CVD. The lower layer 16a and the upper layer 16b are patterned into desired shapes by photolithography and etching. This process forms the upper electrode 16 and the upper additional film 17. The upper electrode 16 and the upper additional film 17 may be formed by liftoff.

In the parallel resonator illustrated in FIG. 1C, after the formation of the lower layer 16a, the frequency control film 20 is formed by, for example, sputtering, vacuum evaporation, or CVD. The frequency control film 20 is patterned into a desired shape by photolithography and etching. Thereafter, the upper layer 16b is formed.

An etching liquid for the sacrifice layers 38 and 38a is introduced into the sacrifice layers 38 and 38a under the lower electrode 12 through the hole portions 35 and the introduction path 33 (see FIG. 1A). This process removes the sacrifice layers 38 and 38a. A substance that does not etch materials constituting the resonator except the sacrifice layers 38 and 38a is preferable for a substance for etching the sacrifice layer 38. Especially, the substance for etching is preferably a substance that etches neither the lower electrode 12 nor the lower additional film 13 with which the substance for etching comes in contact. The stress of the multilayered film from the lower electrode 12 to the upper electrode 16 (or the frequency control film 20) is set so as to be a compression stress. This setting causes the multilayered film to bulge out to the side opposite from the substrate 10 so as to separate from the substrate 10 when the sacrifice layer 38 is removed. Accordingly, the air gap 30 having a dome-shaped bulge is formed between the lower electrode 12 and the substrate 10. The series resonator S illustrated in FIG. 1A and FIG. 1B and the parallel resonator P illustrated in FIG. 1A and FIG. 1C are fabricated through the above processes.

Figure 4A:
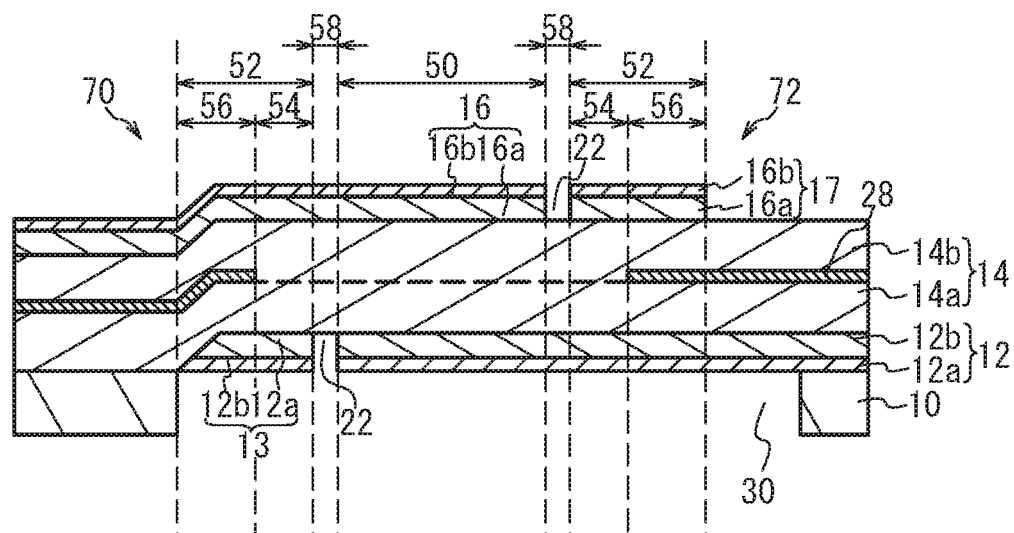
FIG. 4A and FIG. 4B are cross-sectional views of the piezoelectric thin film resonator in accordance with the first embodiment.
Figure 4B:
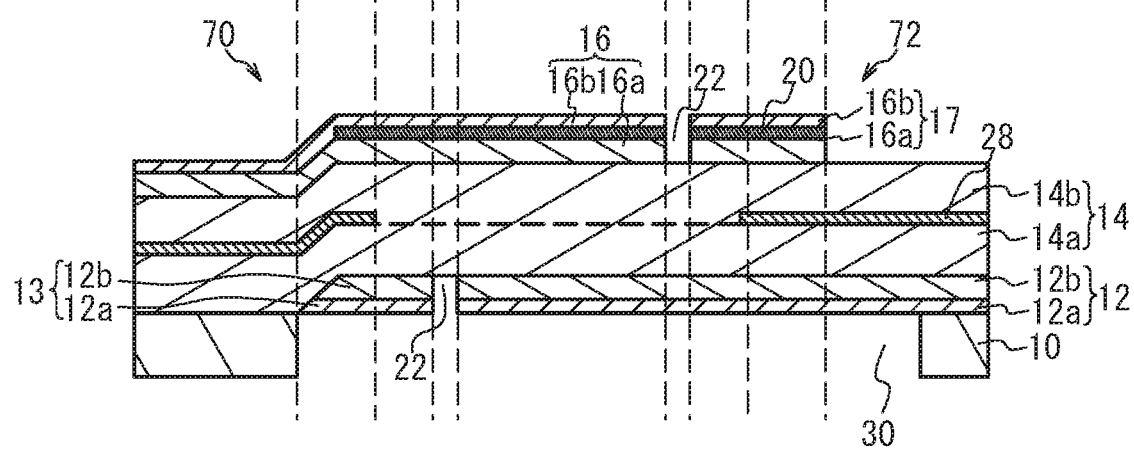

FIG. 4A and FIG. 4B are cross-sectional views of the piezoelectric thin film resonator in accordance with the first embodiment. FIG. 4A and FIG. 4B are cross-sectional views of the series resonator S and the parallel resonator P, respectively. For ease of the description of the following variations, the dome-shaped air gap 30 is represented by an airgap in the substrate 10. Other structures are the same as those illustrated in FIG. 1B and FIG. 1C, and the description thereof is thus omitted.

The acoustic wave is inhibited from leaking from the resonance region 50 to the outside by providing the lower additional film 13 and the upper additional film 17 so as to surround the resonance region 50 as described in the first embodiment. Thereby, the characteristics, including the Q-value, of the resonator are improved.

First Variation of the First Embodiment

Figure 5A:
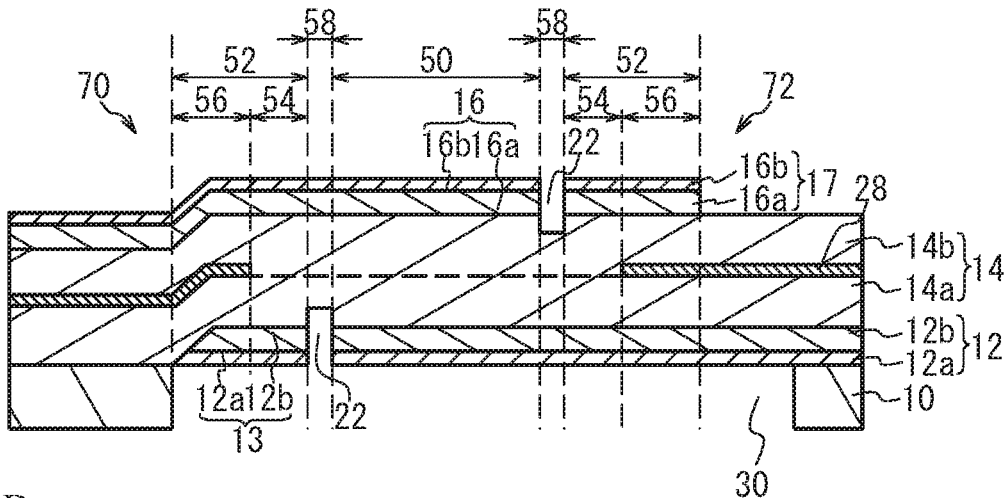
FIG. 5A through FIG. 5C are cross-sectional views of piezoelectric thin film resonators in accordance with first through third variations of the first embodiment.
Figure 5B:
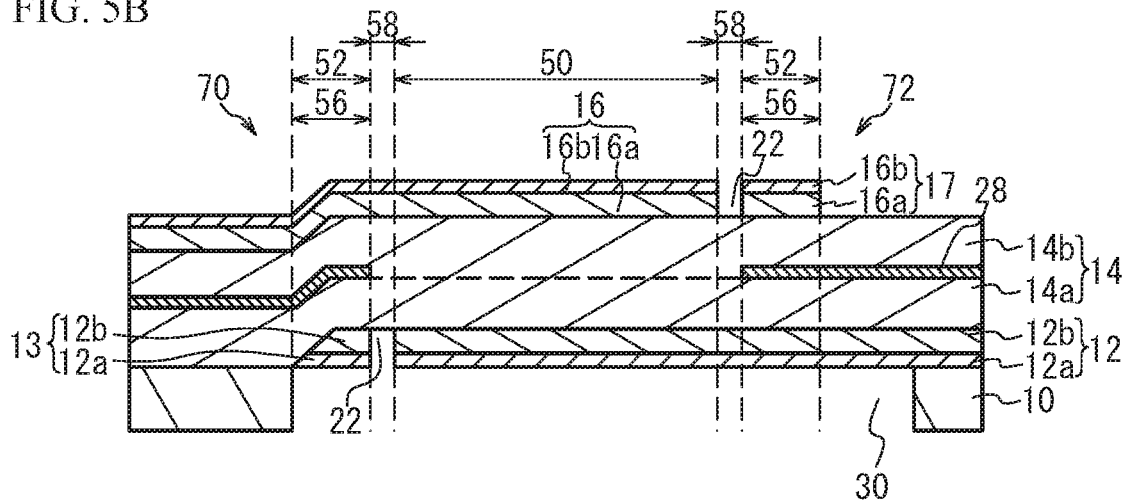
Figure 5C:
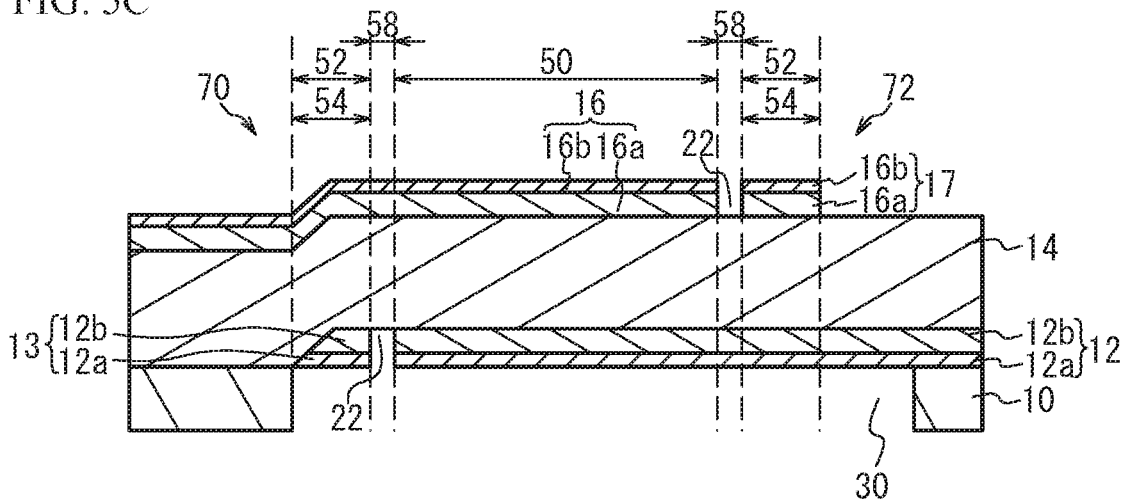
Figure 6A:
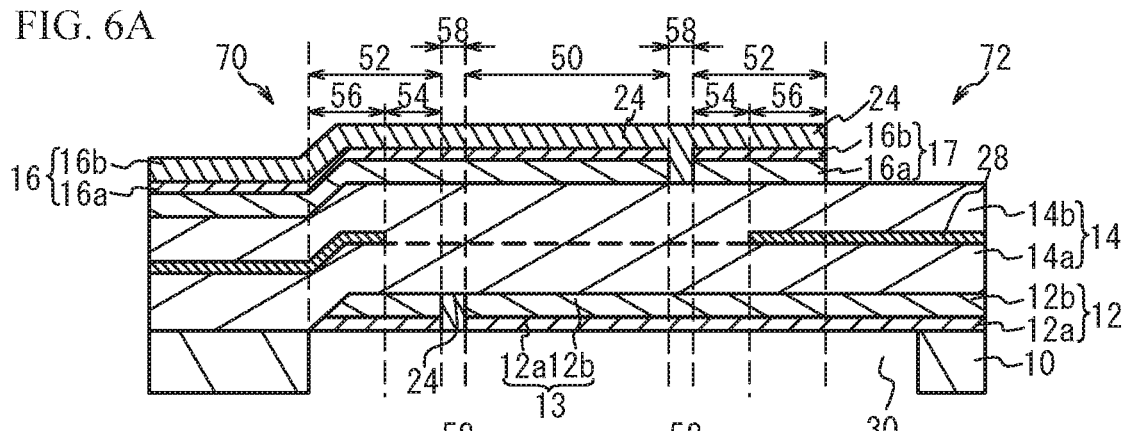
FIG. 6A through FIG. 6D are cross-sectional views of piezoelectric thin film resonators in accordance with a fourth variation of the first embodiment.
Figure 6B:
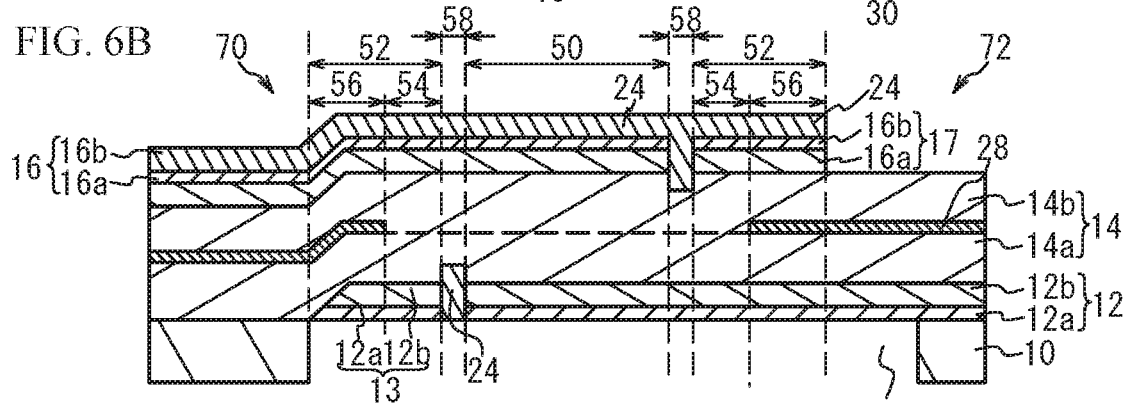
Figure 6C:
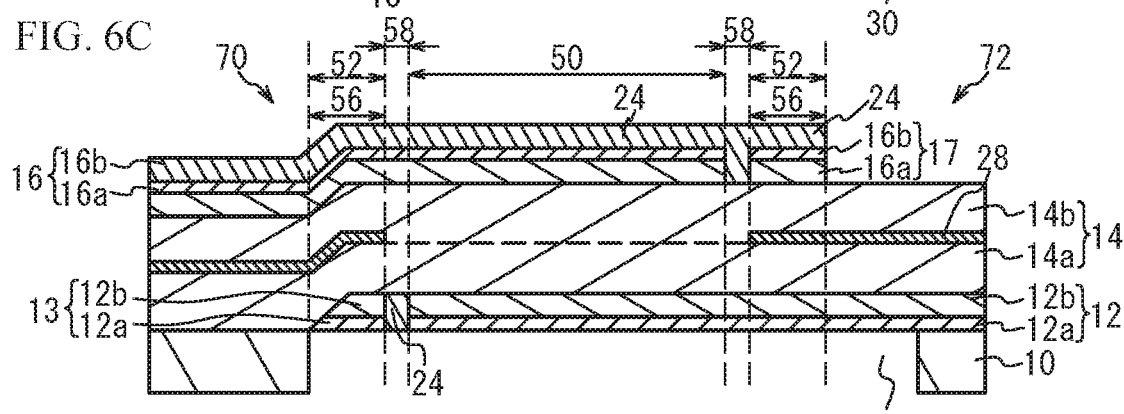
Figure 6D:
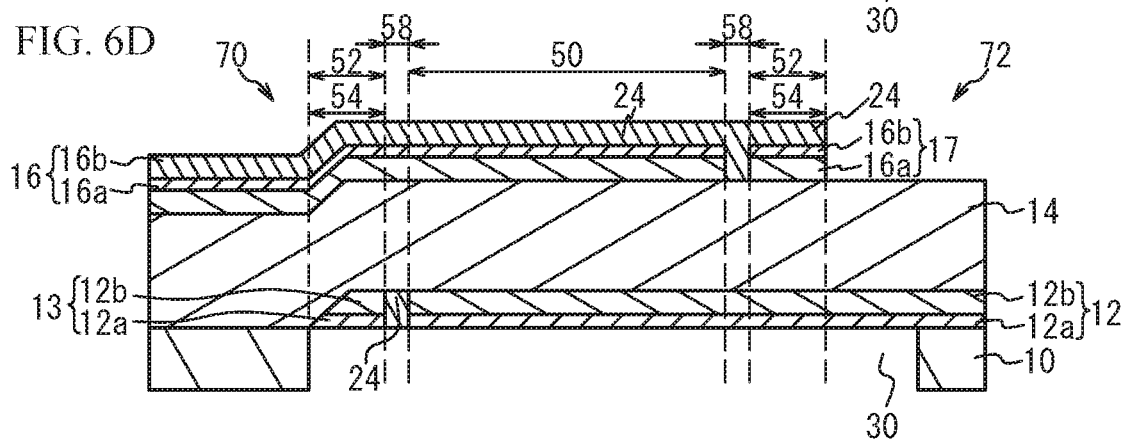

FIG. 5A through FIG. 5C are cross-sectional views of piezoelectric thin film resonators in accordance with first through third variations of the first embodiment, respectively. As illustrated in FIG. 5A, a part of the piezoelectric film 14 may be removed in the separation region 58. Other structures are the same as those of the first embodiment, and the description thereof is thus omitted.

Second Variation of the First Embodiment

As illustrated in FIG. 5B, the additional film region 52 may not necessarily have the non-insertion region 54 having no insertion film 28 inserted, and the entire of the additional film region 52 may be the insertion region 56 having the insertion film 28 inserted. Other structures are the same as those of the first embodiment, and the description thereof is thus omitted. The insertion film 28 may be located in at least a part of the separation region 58.

Third Variation of the First Embodiment

As illustrated in FIG. 5C, the insertion film 28 may not be necessarily inserted in the piezoelectric film 14. The entire of the additional film region 52 becomes the non-insertion region 54 having no insertion film 28 inserted. Other structures are the same as those of the first embodiment, and the description thereof is thus omitted.

The first through third variations of the first embodiment are also able to reduce the leak of the acoustic wave from the resonance region 50, and thereby improve the Q-value by providing the upper additional film 17 and the lower additional film 13 so as to surround the resonance region 50.

Fourth Variation of the First Embodiment

FIG. 6A through FIG. 6D are cross-sectional views of piezoelectric thin film resonators in accordance with a fourth variation of the first embodiment. As illustrated in FIG. 6A through FIG. 6D, an insulating film 24 is located on the upper electrode 16 and the upper additional film 17. The insulating film 24 is embedded between the upper electrode 16 and the upper additional film 17. The insulating film 24 is embedded between the lower electrode 12 and the lower additional film 13. The insulating film 24 is, for example, a silicon oxide film or a silicon nitride film. Other structures are the same as those of the first embodiment and first through third variations thereof, and the description thereof is thus omitted.

In the fourth variation of the first embodiment, the provision of the insulating film 24 improves the electrical insulation property between the upper electrode 16 and the upper additional film 17 and the electrical insulation property between the lower electrode 12 and the lower additional film 13.

Fifth Variation of the First Embodiment

Figure 7A:
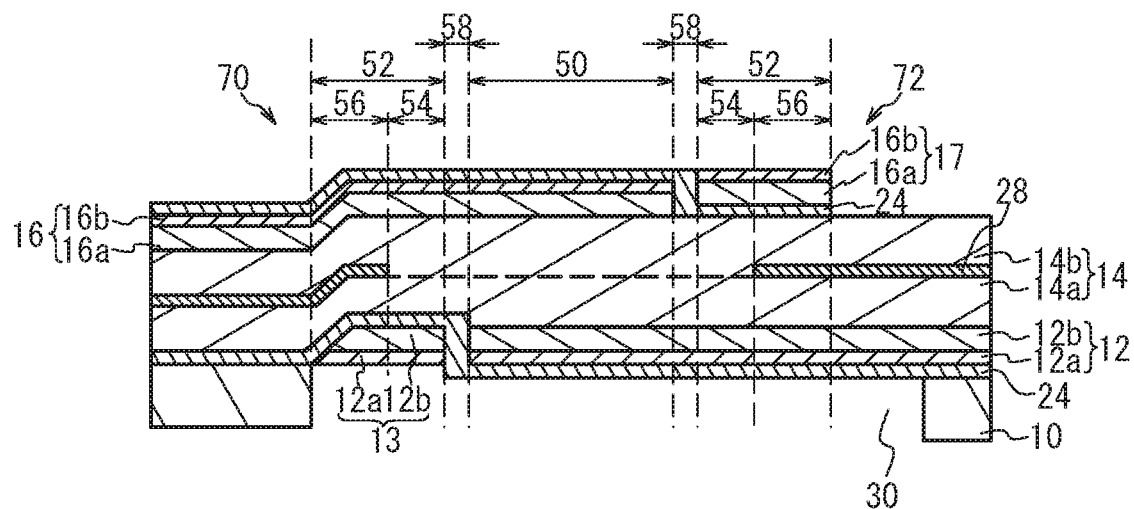
FIG. 7A and FIG. 7B are cross-sectional views of fifth and sixth variations of the first embodiment, respectively.
Figure 7B:
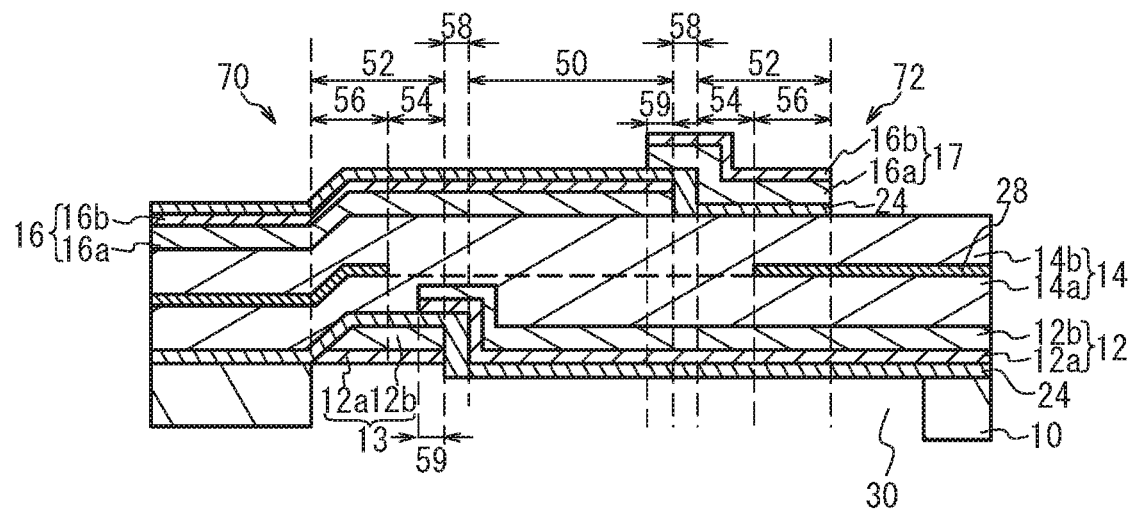

FIG. 7A and FIG. 7B are cross-sectional views of fifth and sixth variations of the first embodiment, respectively. As illustrated in FIG. 7A, the insulating film 24 is located on the upper electrode 16, and the insulating film 24 is located between the upper additional film 17 and the piezoelectric film 14. The insulating film 24 is located between the lower electrode 12 and the substrate 10 or the air gap 30, and the insulating film 24 is located between the lower additional film 13 and the piezoelectric film 14. Other structures are the same as those of the first embodiment, and the description thereof is thus omitted.

The provision of the insulating film 24 between the lower electrode 12 and the piezoelectric film 14 and/or between the upper electrode 16 and the piezoelectric film 14 causes deterioration of the characteristics of the piezoelectric thin film resonator. Thus, the insulating film 24 is provided under the lower electrode 12 and/or on the upper electrode 16. Even when the insulating film 24 is located between the lower additional film 13 and the piezoelectric film 14 and/or between the upper additional film 17 and the piezoelectric film 14, the characteristics do not deteriorate.

Sixth Variation of the First Embodiment

As illustrated in FIG. 7B, the upper additional film 17 may overlap with a part (an overlap region 59) of the upper electrode 16 across the insulating film 24. The lower additional film 13 may overlap with a part (the overlap region 59) of the lower electrode 12 across the insulating film 24. Other structures are the same as those of the fifth variation of the first embodiment, and the description thereof is thus omitted.

Seventh Variation of the First Embodiment

Figure 8A:
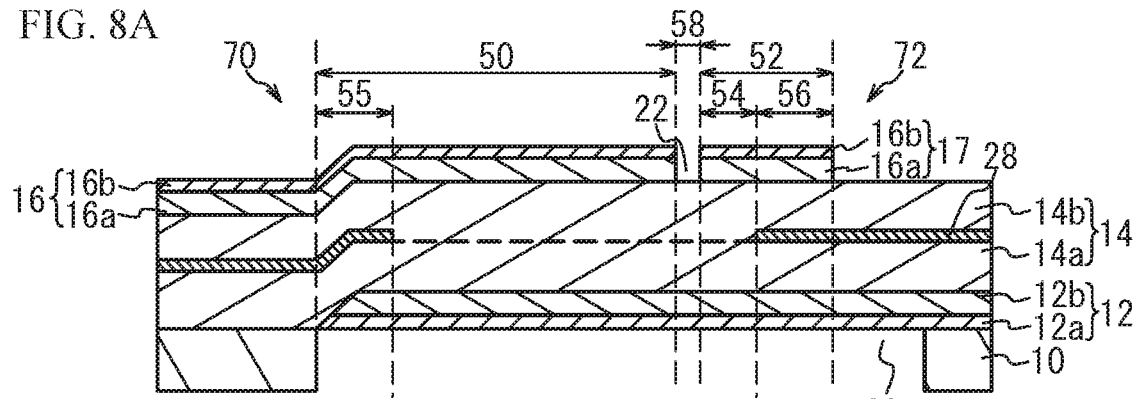
FIG. 8A through FIG. 8D are cross-sectional views of piezoelectric thin film resonators in accordance with a seventh variation of the first embodiment.
Figure 8B:
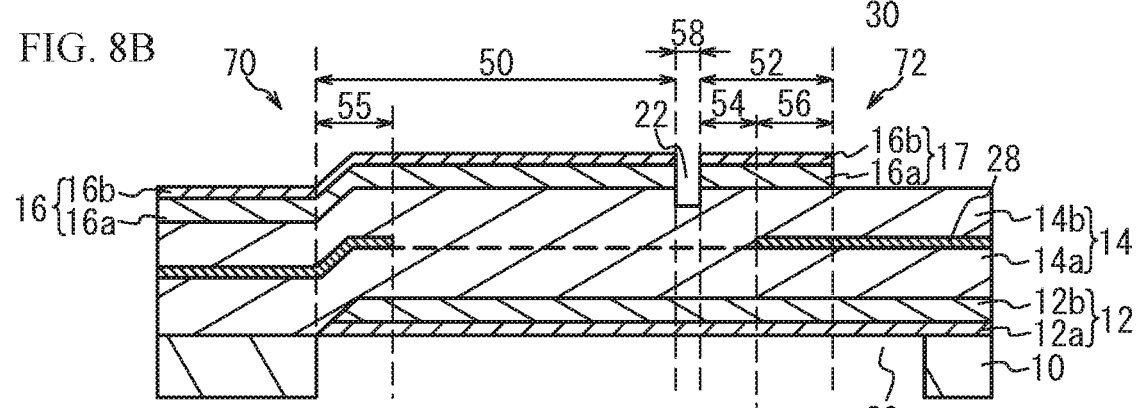
Figure 8C:
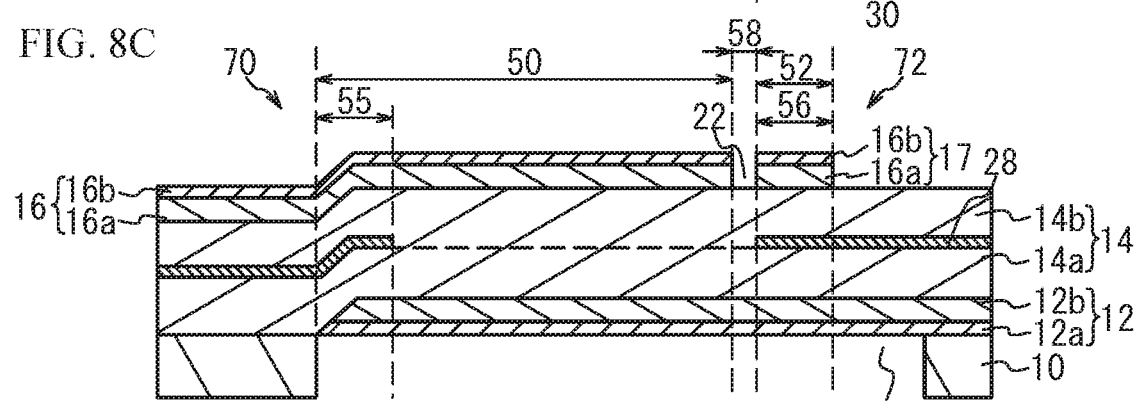
Figure 8D:
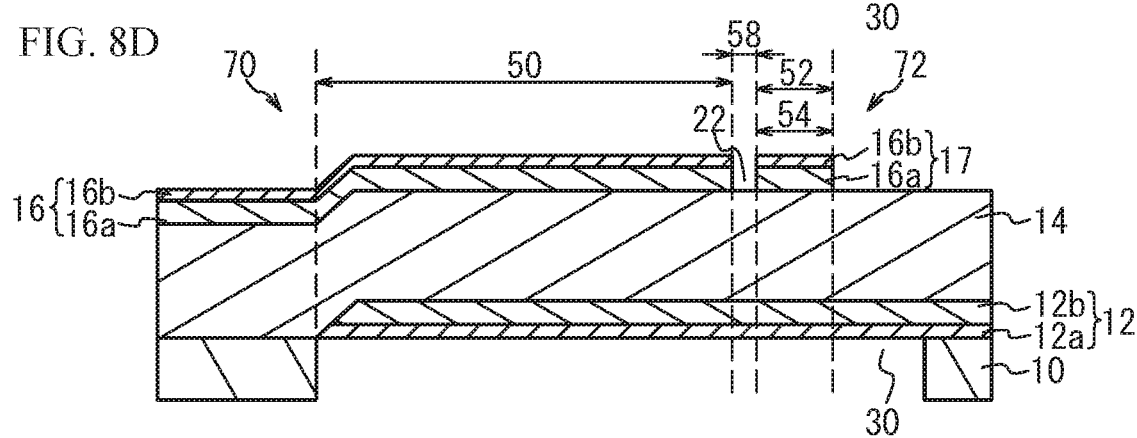
Figure 9A:
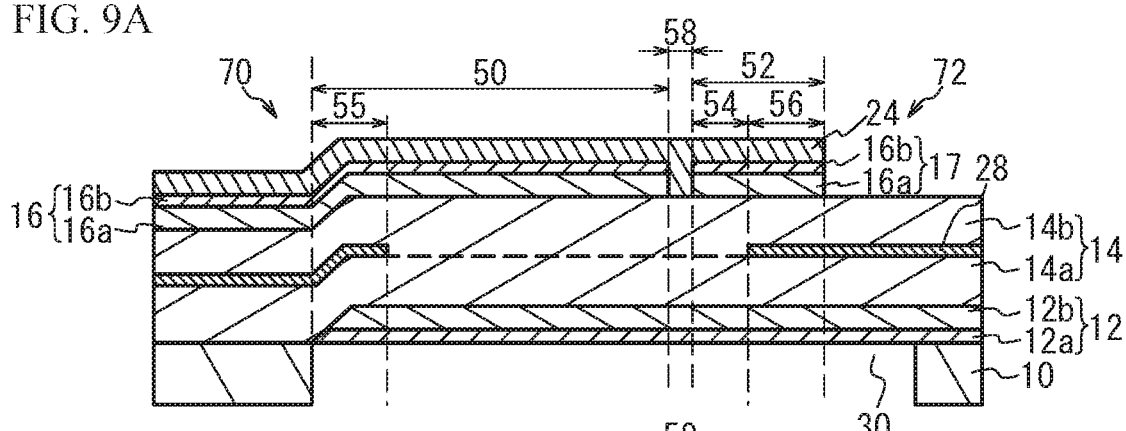
FIG. 9A through FIG. 9D are cross-sectional views of piezoelectric thin film resonators in accordance with an eighth variation of the first embodiment.
Figure 9B:
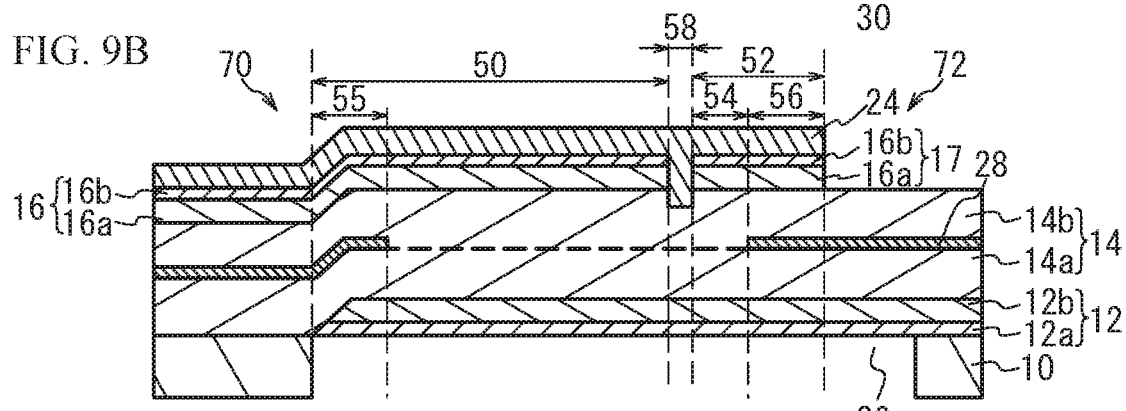
Figure 9C:
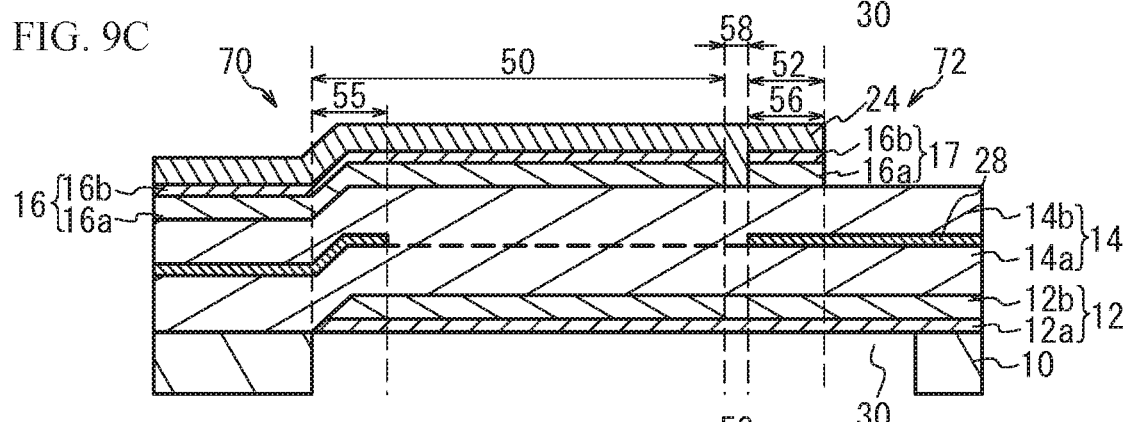
Figure 9D:
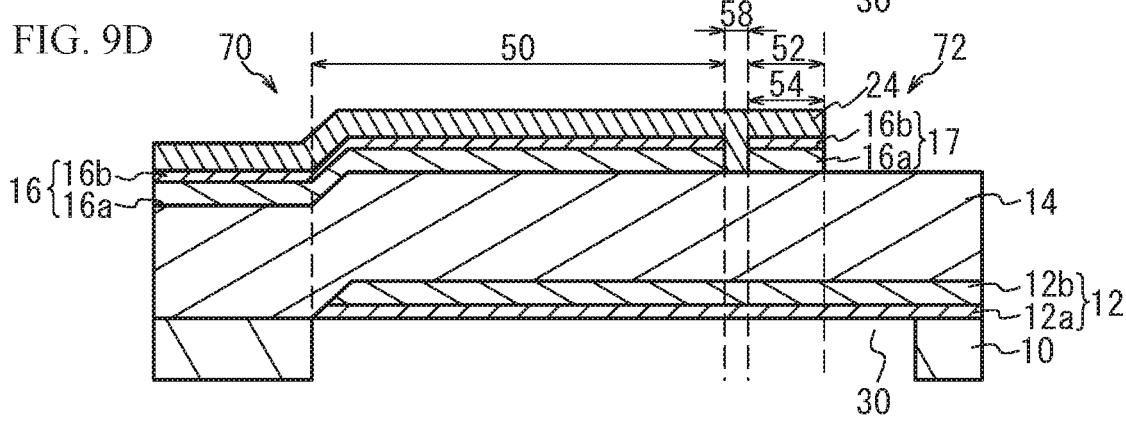

FIG. 8A through FIG. 8D are cross-sectional views of piezoelectric thin film resonators in accordance with a seventh variation of the first embodiment. As illustrated in FIG. 8A through FIG. 8D, the lower additional film 13 is not provided in the extraction region 70. Thus, the additional film region 52 is not located in the extraction region 70. In FIG. 8A through FIG. 8C, in a region 55, which is closer to the extraction region 70, of the resonance region 50, the insertion film 28 is inserted in the piezoelectric film 14. Other structures are the same as those of the first embodiment and the first through third variations thereof, and the description thereof is thus omitted.

Eighth Variation of the First Embodiment

FIG. 9A through FIG. 9D are cross-sectional views of piezoelectric thin film resonators in accordance with an eighth variation of the first embodiment. As illustrated in FIG. 9A through FIG. 9D, the insulating film 24 is located on the upper electrode 16 and the upper additional film 17. The insulating film 24 is located between the upper electrode 16 and the upper additional film 17. Other structures are the same as those of the seventh variation of the first embodiment, and the description thereof is thus omitted.

Ninth Variation of the First Embodiment

Figure 10A:
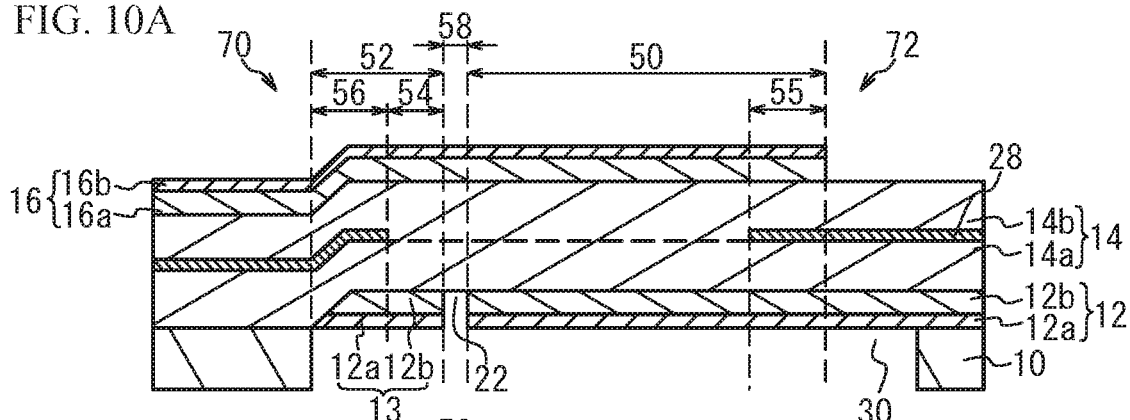
FIG. 10A through FIG. 10D are cross-sectional views of piezoelectric thin film resonators in accordance with a ninth variation of the first embodiment.
Figure 10B:
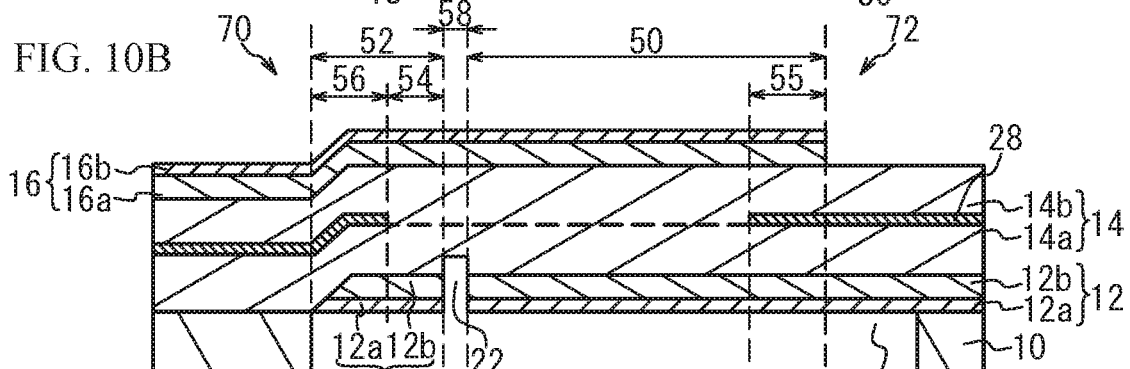
Figure 10C:
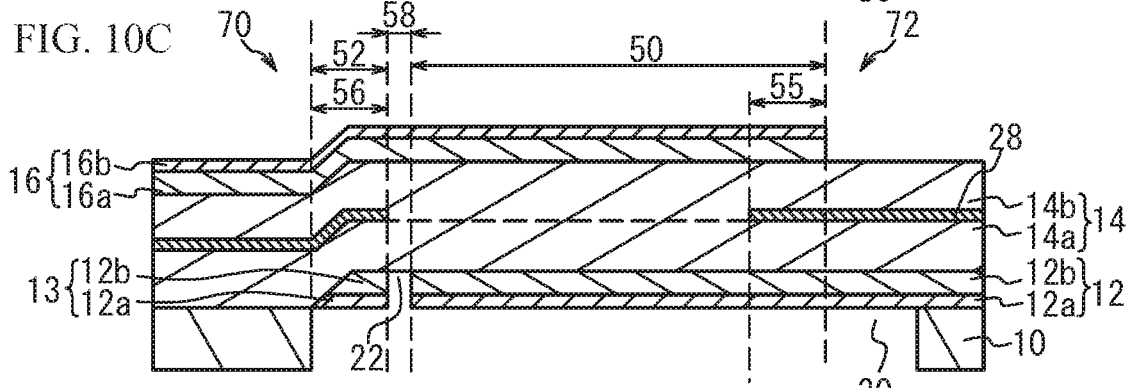
Figure 10D:
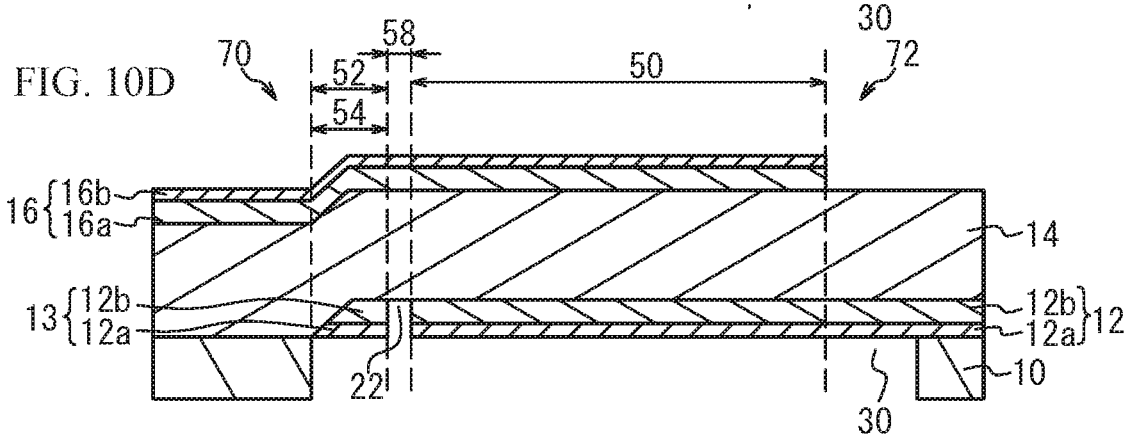
Figure 11A:
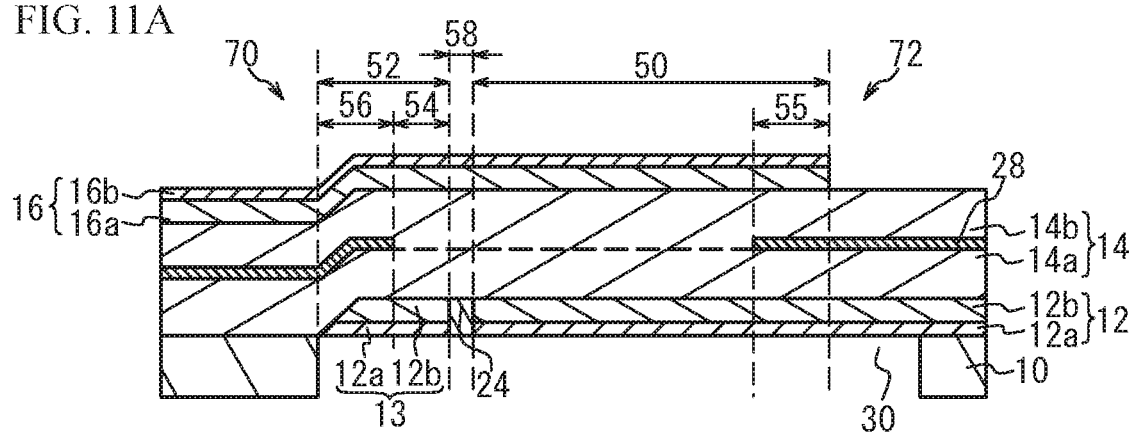
FIG. 11A through FIG. 11D are cross-sectional views of piezoelectric thin film resonators in accordance with a tenth variation of the first embodiment.
Figure 11B:
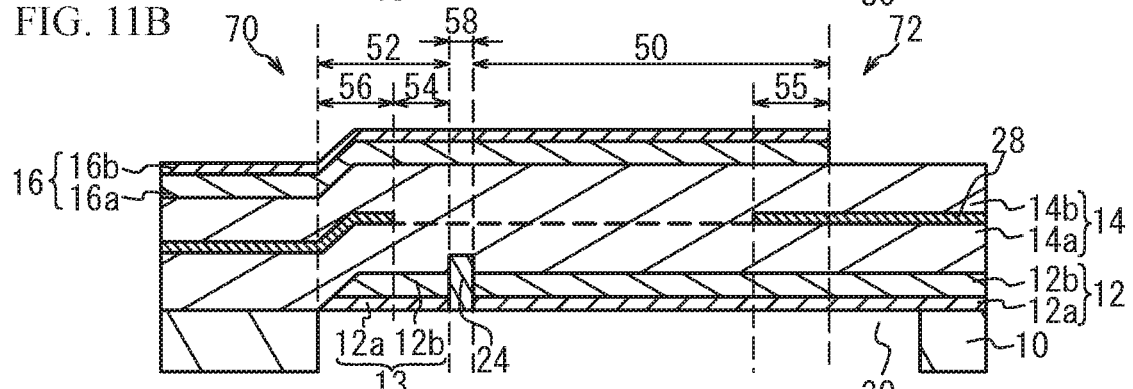
Figure 11C:
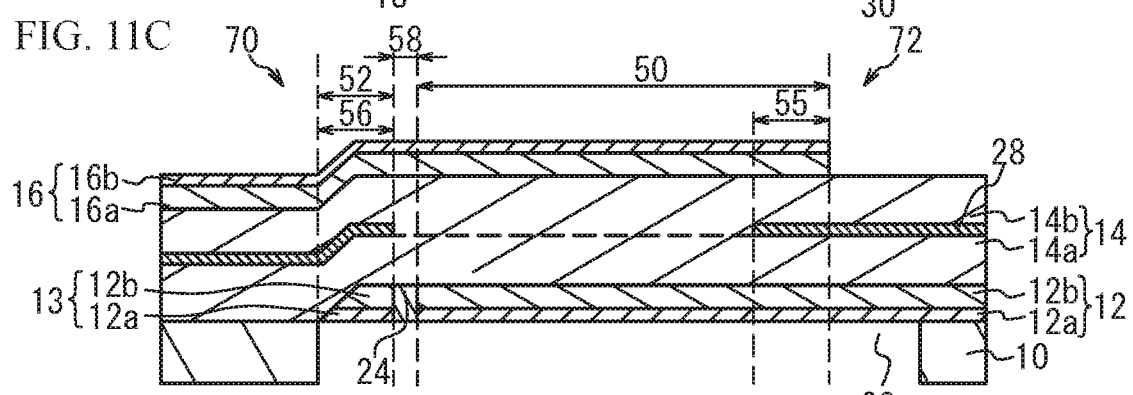
Figure 11D:
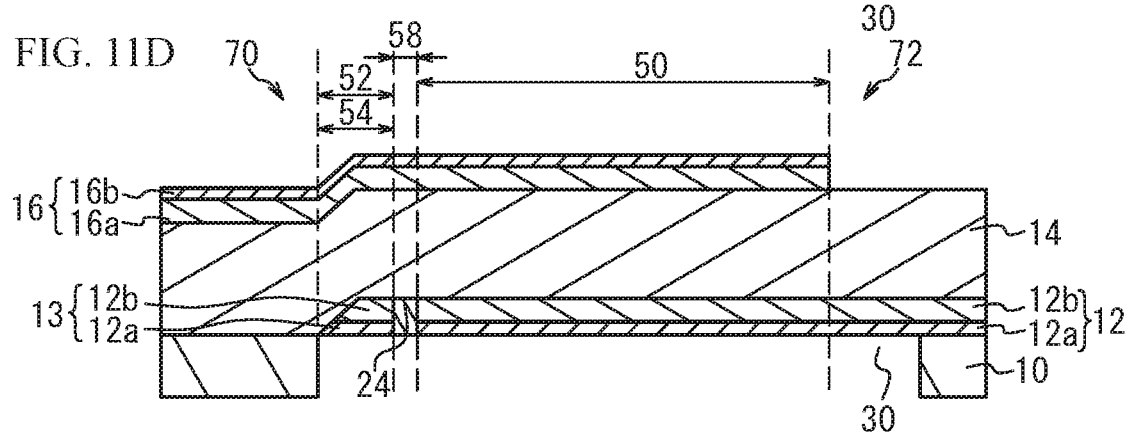

FIG. 10A through FIG. 10D are cross-sectional views of piezoelectric thin film resonators in accordance with a ninth variation of the first embodiment. As illustrated in FIG. 10A through FIG. 10D, the upper additional film 17 is not provided in the region 72. In FIG. 10A through FIG. 10C, in the region 55, which is closer to the region 72, of the resonance region 50, the insertion film 28 is inserted in the piezoelectric film 14. Other structures are the same as those of the first embodiment and the first through third variations thereof, and the description thereof is thus omitted.

Tenth Variation of the First Embodiment

FIG. 11A through FIG. 11D are cross-sectional views of piezoelectric thin film resonators in accordance with a tenth variation of the first embodiment. As illustrated in FIG. 11A through FIG. 11D, the insulating film 24 is located between the lower electrode 12 and the lower additional film 13. Other structures are the same as those of the ninth variation of the first embodiment, and the description thereof is thus omitted.

As described in the seventh through tenth variations of the first embodiment, the additional film region 52 may be provided in a part of the region surrounding the resonance region 50, and may not be necessarily provided in a part of the region surrounding the resonance region 50. In the region that surrounds the resonance region 50 and has no additional film region 52 located therein, the insertion film 28 may be located within the resonance region 50.

Structures of Simulated Samples

Figure 12A:
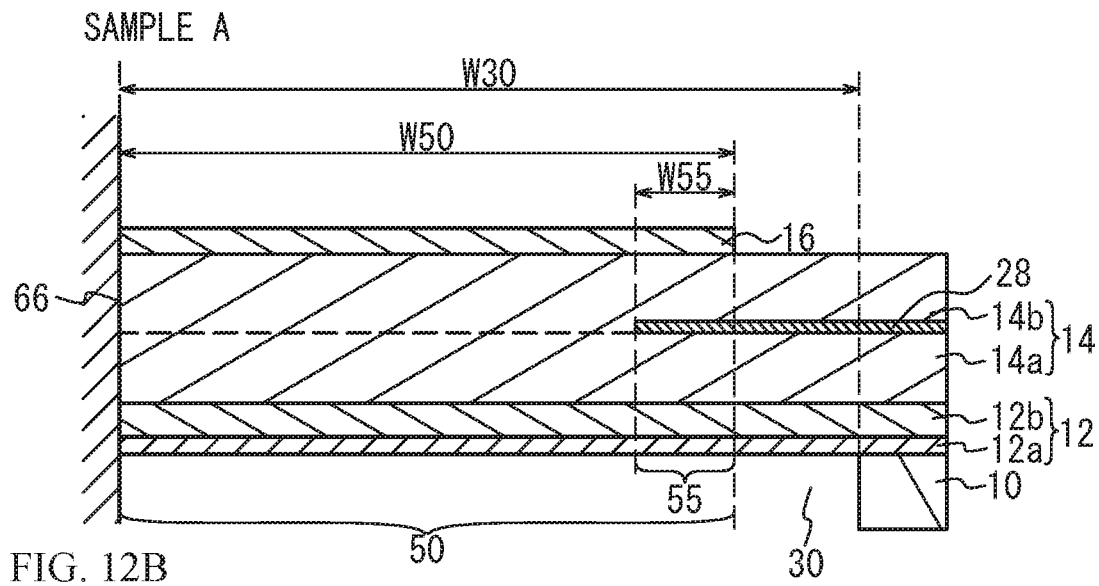
FIG. 12A through FIG. 12C illustrate cross-section structures of samples A through C subject to a simulation, respectively.
Figure 12B:
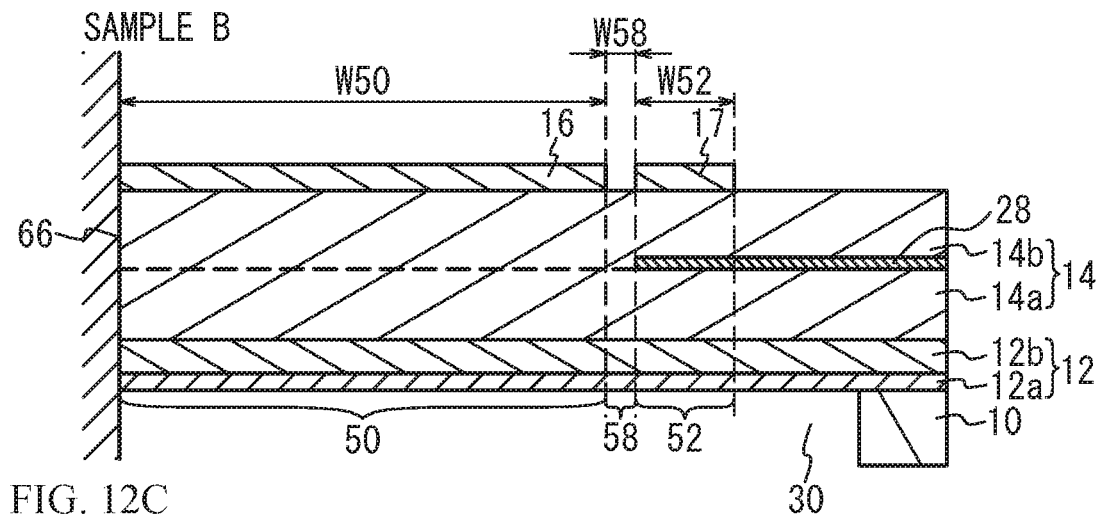
Figure 12C:
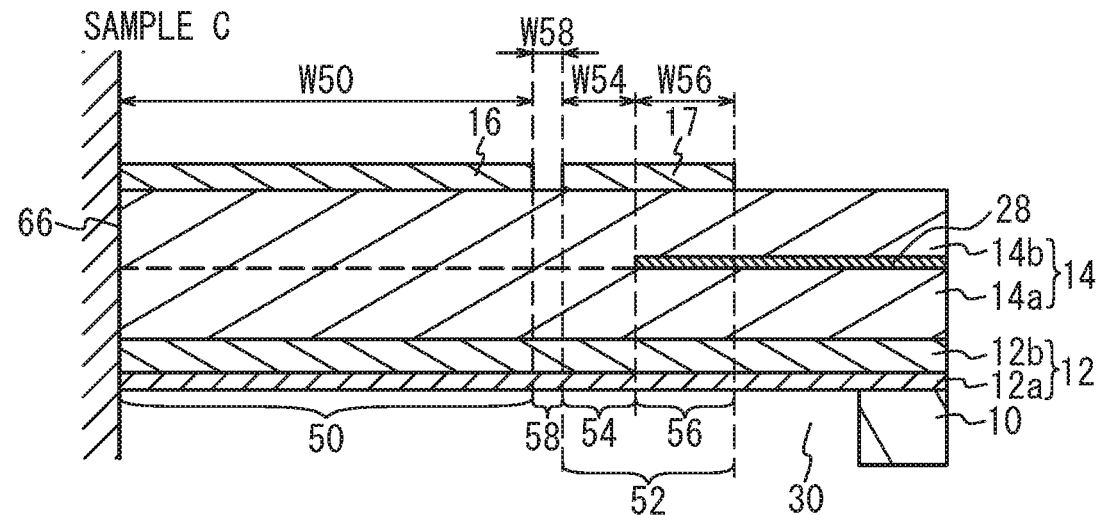

The Q-value and spurious of each of the piezoelectric thin film resonators in accordance with the first embodiment and the variations thereof were simulated by using a two-dimensional finite element method. FIG. 12A through FIG. 12C respectively illustrate the cross-section structures of samples A through C subject to the simulation. The samples A through C are samples having the insertion film 28. The sample A corresponds to a comparative example, and the samples B and C correspond to the first embodiment and the variations thereof.

As illustrated in FIG. 12A through FIG. 12C, the center of the resonance region 50 was assumed to be a mirror boundary face 66. The half of the width of the resonance region 50 is represented by W50, and the half of the width of the air gap 30 is represented by W30.

As illustrated in FIG. 12A, in the sample A, the insertion film 28 is inserted in the piezoelectric film 14 in the outer peripheral region of the resonance region 50. The width of the region 55 in which the insertion film 28 is inserted in the resonance region 50 is represented by W55. As illustrated in FIG. 12B, in the sample B, the additional film region 52, in which the upper additional film 17 is provided, is located further out than the resonance region 50. The insertion film 28 is inserted in the piezoelectric film 14 in the additional film region 52. The insertion film 28 is not located in the resonance region 50. The width of the separation region 58 is represented by W58, and the width of the additional film region 52 is represented by W52.

As illustrated in FIG. 12C, in the sample C, the inner region of the additional film region 52 is the non-insertion region 54 having no insertion film 28 located therein, and the outer region of the additional film region 52 is the insertion region 56 having the insertion film 28 located therein. The width of the non-insertion region 54 is represented by W54, and the width of the insertion region 56 is represented by W56.

Figure 13A:
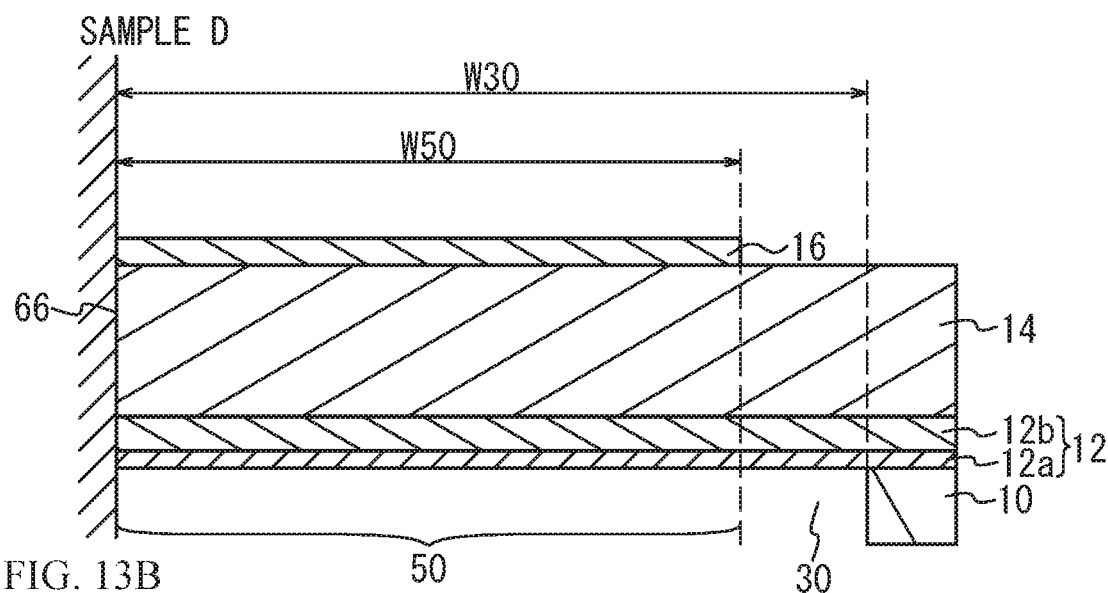
FIG. 13A and FIG. 13B illustrate cross-section structures of samples D and E subject to the simulation, respectively.
Figure 13B:
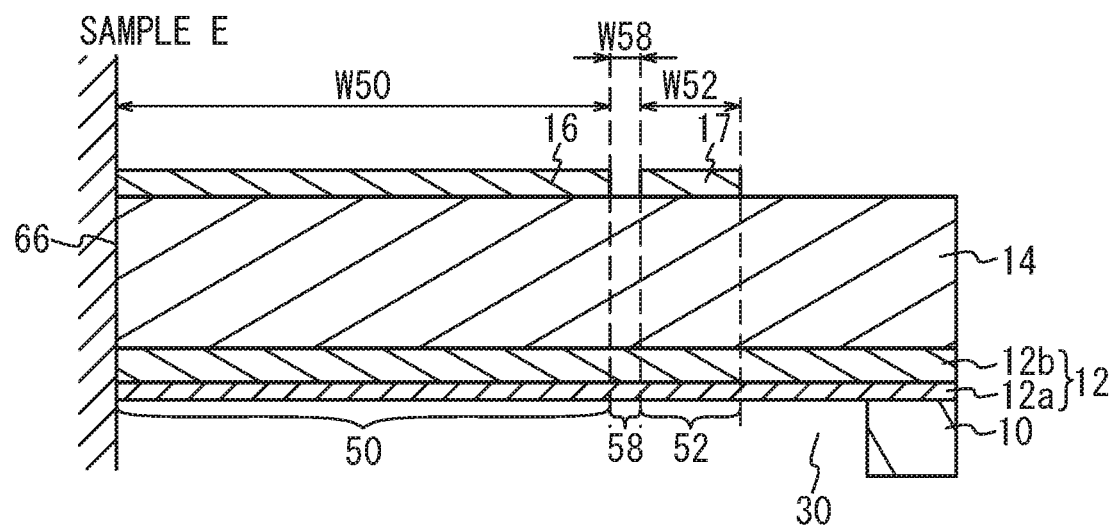

FIG. 13A and FIG. 13B illustrate the cross-section structures of the samples D and E subject to the simulation. The samples D and E are samples having no insertion film 28. The sample D corresponds to the comparative example, and the sample E corresponds to the first embodiment and the variations thereof.

As illustrated in FIG. 13A, the sample D has neither the insertion film 28 nor the upper additional film 17. The half of the width of the resonance region 50 is represented by W50. As illustrated in FIG. 13B, the sample E has the upper additional film 17. The width of the additional film region 52 is represented by W52, and the width of the separation region 58 is represented by W58.

The materials and the film thicknesses used for the simulation are as follows.

Lower layer 12a of the lower electrode 12: Cr film with a film thickness of 100 nm
Upper layer 12b of the lower electrode 12: Ru film with a film thickness of 200 nm
Piezoelectric film 14: AlN film with a film thickness of 1260 nm
Lower piezoelectric film 14a: AlN film with a film thickness of 630 nm (samples A through C)
Upper piezoelectric film 14b: AlN film with a film thickness of 630 nm (samples A through C)
Insertion film 28: Silicon oxide film with a film thickness of 150 nm (samples A through C)

Upper electrode 16: Ru film with a film thickness of 230 nm
Upper additional film 17: Ru film with a film thickness of 230 nm
Width W30 of the air gap 30: 55 μm
Sample A
   Width W50 of the resonance region 50: 42 μm
   Width W55 of the region 55: 3.2 μm
Sample B
   Width W50 of the resonance region 50: 38.7 μm
   Width W58 of the separation region 58: 0.1 μm
   Width W52 of the additional film region 52: 3.2 μm
Sample C
   Width W50 of the resonance region 50: 36.1 μm
   Width W58 of the separation region 58: 0.1 μm
   Width W54 of the non-insertion region 54: 2.6 μm
   Width W58 of the insertion region 56: 3.2 μm
Sample D
   Width W50 of the resonance region 50: 42 μm
Sample E
   Width W50 of the resonance region 50: 39.8 μm
   Width W58 of the separation region 58: 0.2 μm
   Width W52 of the additional film region 52: 2 μm FIG. 14 presents the Q-value at the antiresonant frequency, the electromechanical coupling coefficient, and the intensity of spurious in each of the samples A through E. The intensity of spurious is the intensity of the largest spurious in frequencies from the resonant frequency to 50 MHz. As illustrated in FIG. 14, the samples A through C have larger Q-values than the samples D and E. This is because the acoustic wave leaking from the resonance region 50 to the outside is reflected by the insertion film 28 by providing the insertion film 28, and thereby the acoustic wave energy is inhibited from leaking from the resonance region 50.

The samples B and C have larger Q-values than the sample A. This is because the leak of the acoustic wave from the resonance region 50 is reduced by providing the upper additional film 17 as well as the insertion film 28. Furthermore, the samples B and C have larger electromechanical coupling coefficients $k^2$ than the sample A. The reason is as follows. In the samples B and C, the insertion film 28 is not located within the resonance region 50, and the upper additional film 17 is electrically separated from the upper electrode 16 and has a floating electric potential. Thus, the excitation efficiency is improved.

The sample E has a larger Q-value than the sample D. This is because the leak of the acoustic wave from the resonance region 50 to the outside is reduced by providing the upper additional film 17 without providing the insertion film 28. The samples D and E have identical electromechanical coupling coefficients.

Figure 15A:
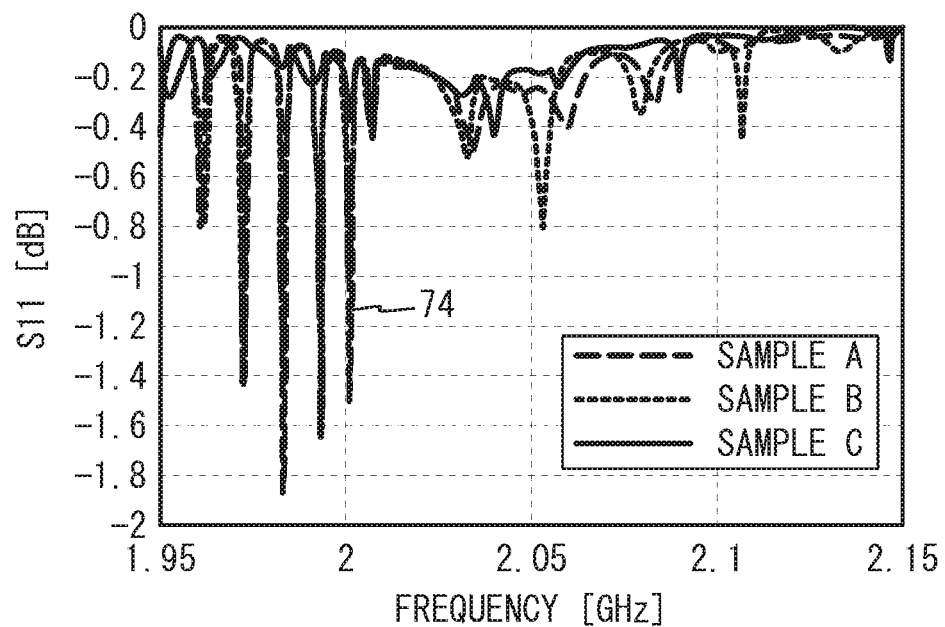
FIG. 15A is a graph of the magnitude of S11 of the samples A through C versus frequency.
Figure 15B:
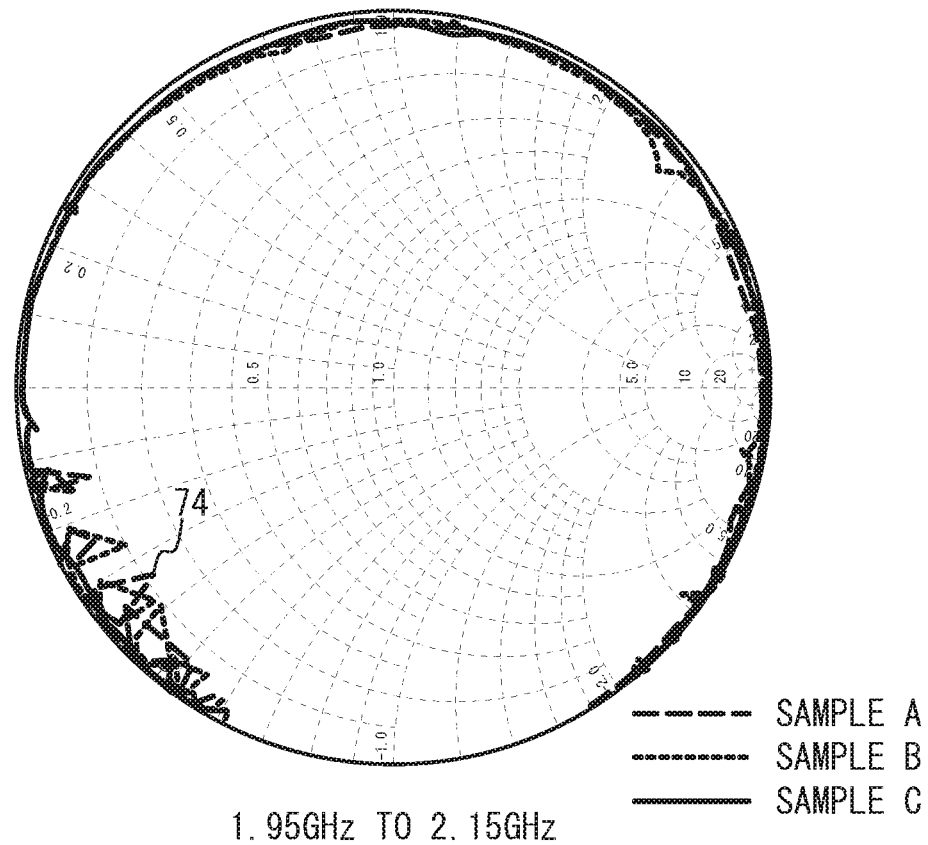
FIG. 15B is a Smith chart of S11 of the samples A through C.

FIG. 15A is a graph of the magnitude of S11 of the samples A through C versus frequency, and FIG. 15B is a Smith chart of S11 of the samples A through C. The frequency is from 1.95 GHz to 2.15 GHz. As illustrated in FIG. 15A and FIG. 15B, large spurious 74 is observed in the samples A and B. In the sample C, spurious is small. As illustrated in FIG. 14, the intensity of spurious (the intensity of the largest spurious in frequencies from the resonant frequency to 50 MHz) of the sample C is approximately one fourth of those of the samples A and B. As described above, spurious is reduced by providing the additional film region 52 so as to surround the resonance region 50 and providing the non-insertion region 54, which has no insertion film 28 formed therein, inside the insertion region 56, which has the insertion film 28 formed therein, in the additional film region 52.

Figure 16A:
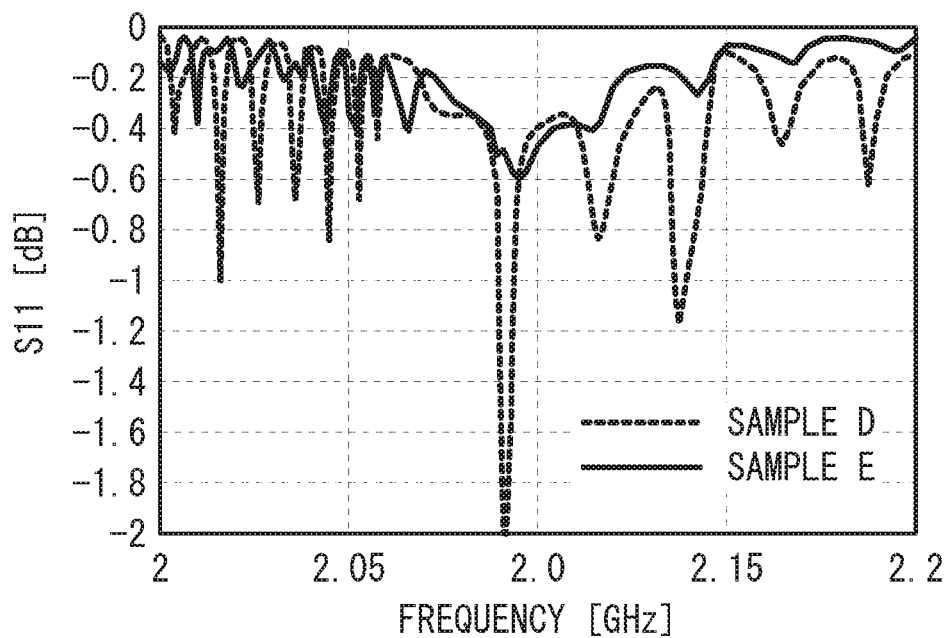
FIG. 16A is a graph of the magnitude of S11 of the samples D and E versus frequency.
Figure 16B:
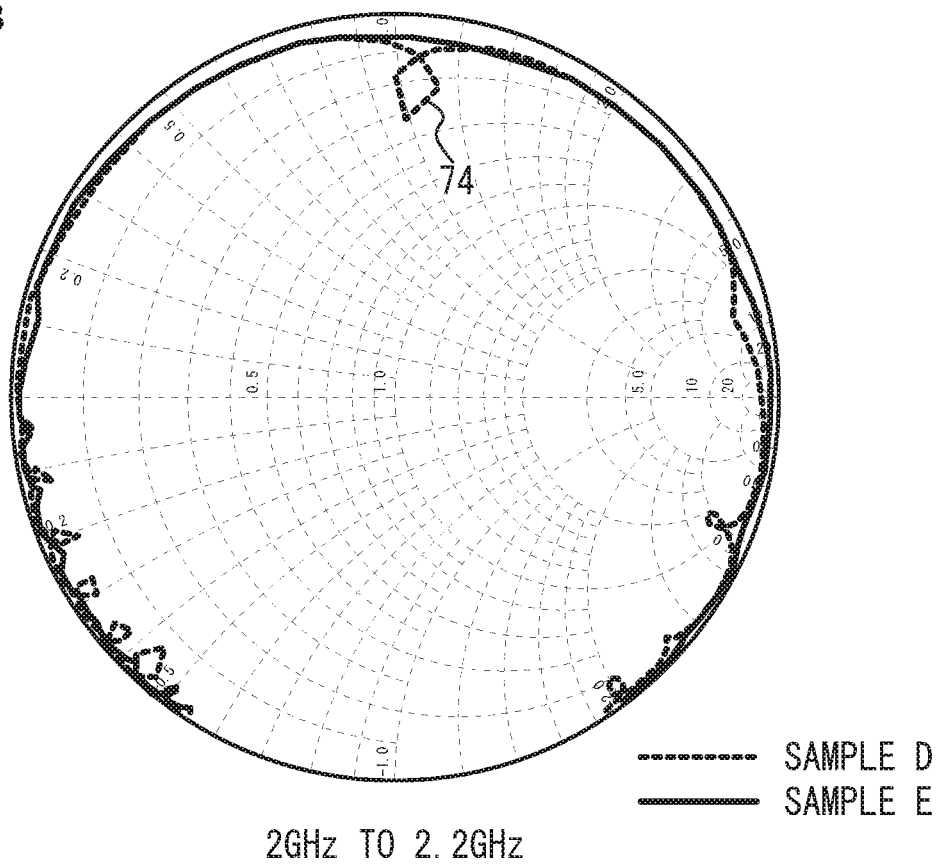
FIG. 16B is a Smith chart of S11 of the samples D and E.

FIG. 16A is a graph of the magnitude of S11 of the samples D and E versus frequency, and FIG. 16B is a Smith chart of S11 of the samples D and E. As illustrated in FIG. 16A and FIG. 16B, the sample E has smaller spurious 74 than the sample D. As clear from the result, spurious is reduced by providing the additional film region 52 even in the samples having no insertion film 28.

The reason why spurious is reduced in the samples C and E will be described. Simulated was the dispersion characteristic of the acoustic wave in the lateral mode (the acoustic wave propagating in the lateral direction) in the sample C. The simulation conditions are the same as the above conditions. The simulated mode of the acoustic wave is a primary mode used in the piezoelectric thin film resonator.

Figure 17:
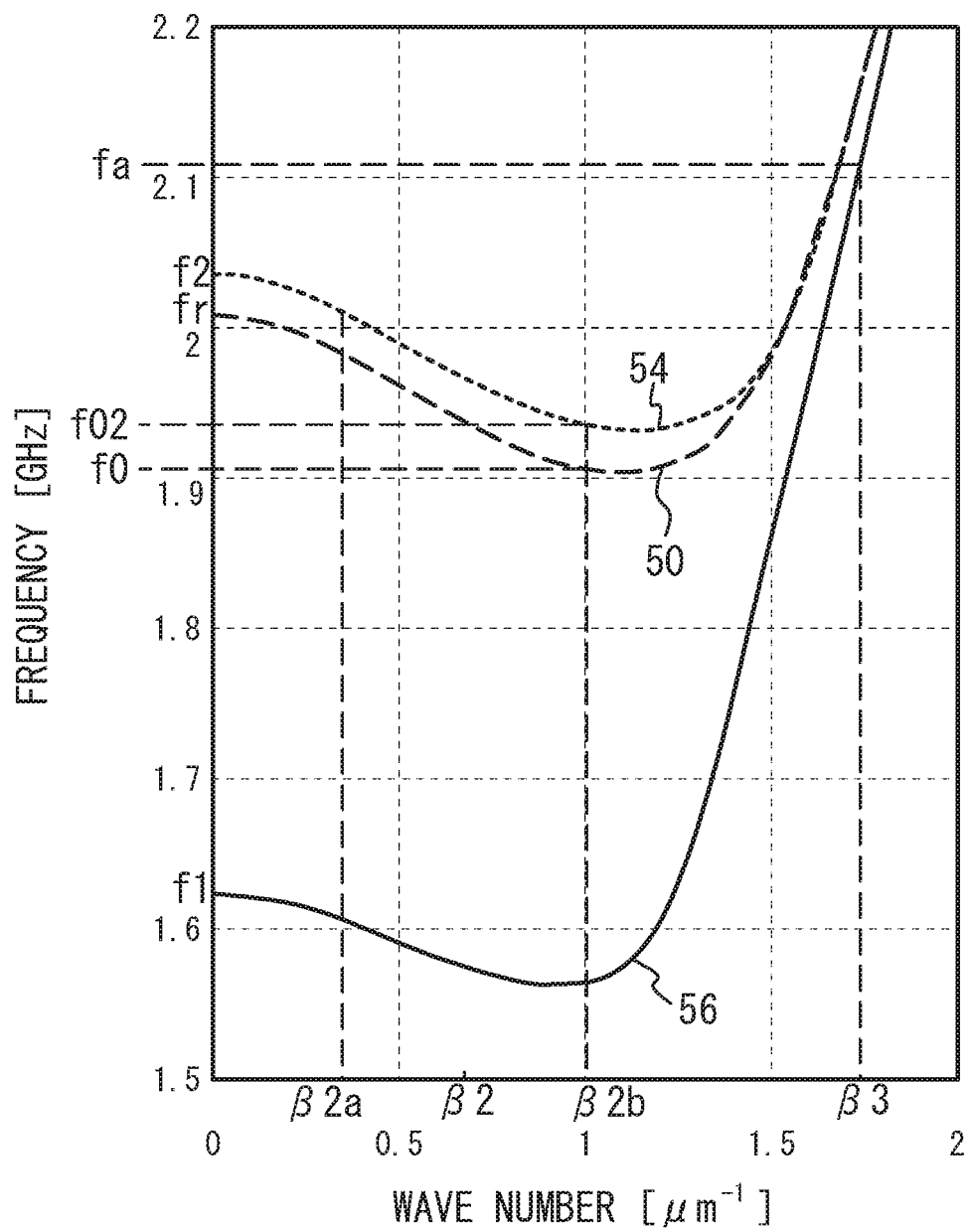
FIG. 17 illustrates the dispersion characteristics of the lateral mode in the first embodiment.

FIG. 17 illustrates the dispersion characteristics of the lateral mode in the first embodiment. The dispersion characteristics in the resonance region 50, the non-insertion region 54, and the insertion region 56 are illustrated. In FIG. 17, the horizontal axis represents the wave number in the lateral direction, and the vertical axis represents frequency. When the wave number is 0, the acoustic wave does not propagate in the lateral direction, and the response in the thickness extension mode occurs. When the wave number is greater than 0, the acoustic wave propagates in the lateral direction, and becomes the acoustic wave in the lateral mode. The frequency at which the wave number of the dispersion characteristic in the resonance region 50 is 0 is the resonant frequency fr of the piezoelectric thin film resonator. In the resonance region 50, as the wave number increases from 0, the frequency decreases. The frequency has a bottom at f0, and thereafter, the frequency increases as the wave number increases. In the frequency band between f0 and fr in frequency, the acoustic wave in the lateral mode can propagate in the resonance region 50. When the acoustic wave in the lateral mode is reflected near the edge of the resonance region 50 and becomes a standing wave in the resonance region 50, spurious occurs.

The structure of the multilayered film from the lower electrode 12 to the upper additional film 17 in the non-insertion region 54 is the same as the structure of the multilayered film from the lower electrode 12 to the upper electrode 16 in the resonance region 50. In the resonance region 50, an alternate current signal is applied to the upper electrode 16, while the upper additional film 17 is electrically floating. Thus, the dispersion characteristic in the non-insertion region 54 shifts to a slightly higher frequency than the dispersion characteristic in the resonance region 50. The cutoff frequency at which the wave number in the non-insertion region 54 is 0 is f2 that is slightly higher than the resonant frequency fr.

In the insertion region 56, since the insertion film 28 is inserted in the piezoelectric film 14, the thickness of the multilayered film is thick, and the weight of the multilayered film is heavy. Thus, the dispersion characteristic greatly shifts to a lower frequency. The cutoff frequency at which the wave number in the insertion region 56 is 0 is f1 that is lower than the resonant frequency fr.

Figure 18A:
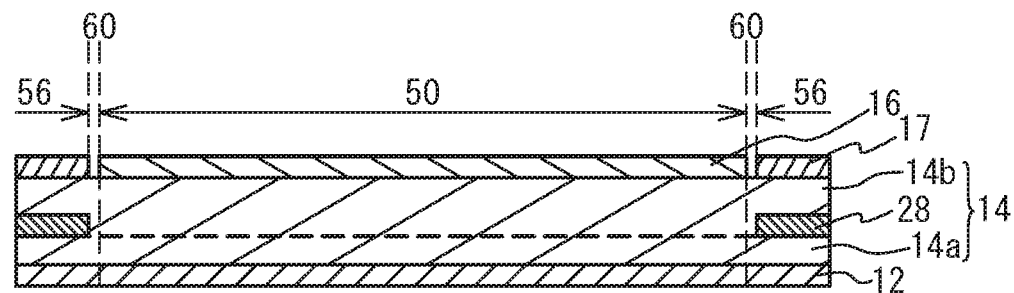
FIG. 18A is a cross-sectional view of a structure having an insertion region located further out than the resonance region.
Figure 18A:
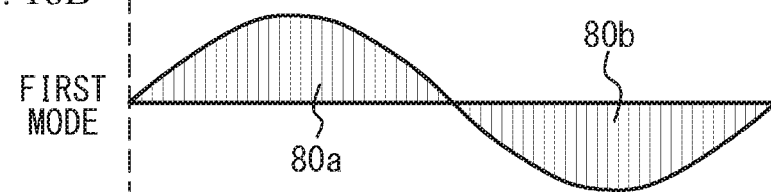
Figure 18A:
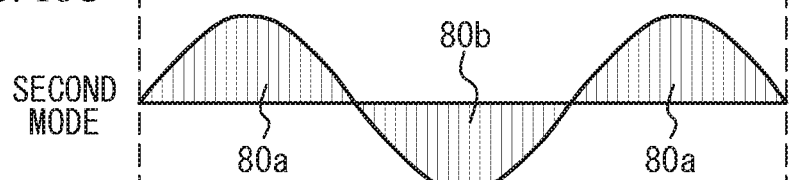
Figure 18A:
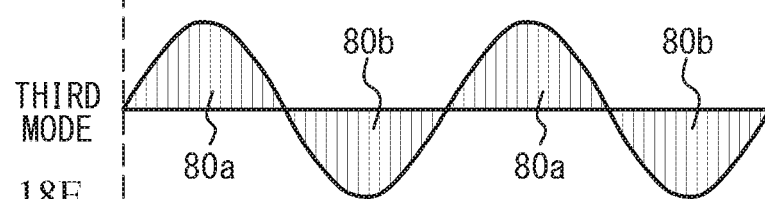
Figure 18A:
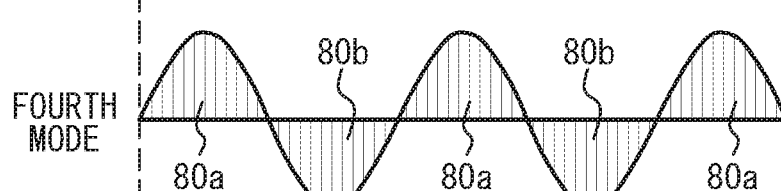

FIG. 18A is a cross-sectional view of the structure having the insertion region located further out than the resonance region, and FIG. 18B through FIG. 18E illustrate electrical signals of first-mode through fourth-mode standing waves of the lateral mode acoustic wave, respectively. As illustrated in FIG. 18A, the insertion regions 56 where the insertion film 28 is inserted are located at both sides of the resonance region 50 across the separation regions 58. This structure corresponds to the sample B. The lateral mode acoustic wave propagating through the resonance region 50 in the lateral direction and having a frequency from fr to f0 in FIG. 17 passes through the separation regions 58 when the width of the separation region 58 is small. However, since the cutoff frequency f1 in the insertion region 56 is lower than the frequency from fr to f0 as illustrated in FIG. 17, the lateral mode acoustic wave propagating through the resonance region 50 is unable to propagate through the insertion region 56. Thus, a boundary 60 between the resonance region 50 and the insertion region 56 becomes a fixed end.

As illustrated in FIG. 18B through FIG. 18E, the boundary 60 becomes the node of the standing wave. In the first mode and the third mode, the sum of areas 80a of positive electrical signals of the standing wave in the resonance region 50 is equal to the sum of areas 80b of negative electrical signals of the standing wave in the resonance region 50. Thus, spurious does not occur. In the second mode and the fourth mode, the sum of the areas 80a of the positive electrical signals of the standing wave in the resonance region 50 differs from the sum of the areas 80b of the negative electrical signals of the standing wave in the resonance region 50. Thus, spurious occurs.

Figure 19A:
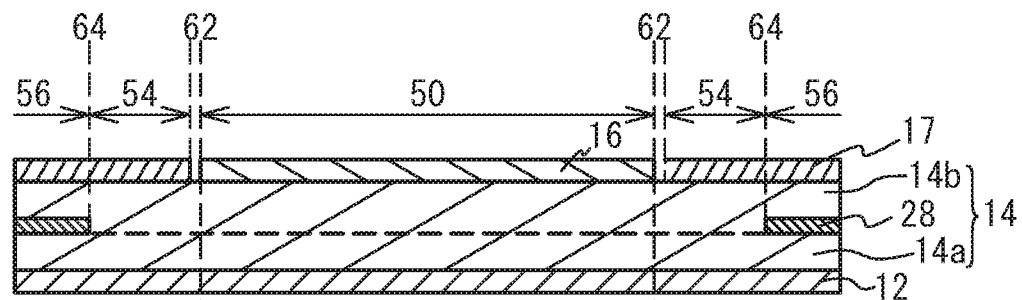
FIG. 19A is a cross-sectional view of a structure having a non-insertion region and the insertion region located further out than the resonance region.
Figure 19B:
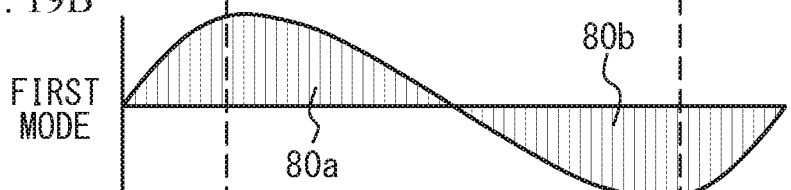
FIG. 19B through FIG. 19E illustrate electrical signals of first-mode through fourth-mode standing waves of the lateral mode acoustic wave, respectively.
Figure 19C:
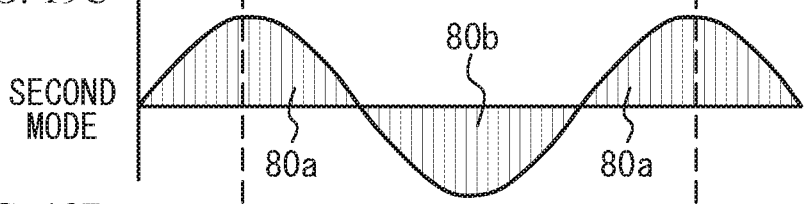
Figure 19D:
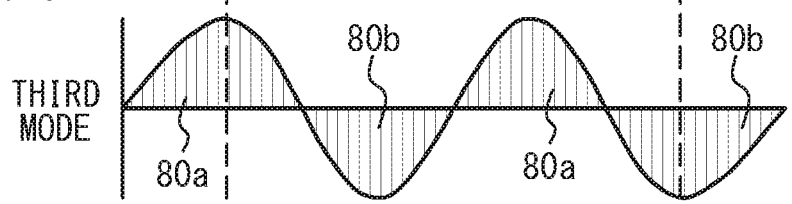

FIG. 19A is a cross-sectional view of the structure having the non-insertion region and the insertion region located further out than the resonance region, and FIG. 19B through FIG. 19E illustrate electrical signals of first-mode through fourth-mode standing waves of the lateral mode acoustic wave, respectively. As illustrated in FIG. 19A, the non-insertion regions 54 in which no insertion film 28 is inserted are located at both sides of the resonance region 50 across the separation regions 58, and the insertion region 56 is located outside the non-insertion region 54. This structure corresponds to the sample C of the first embodiment. As illustrated in FIG. 17, the cutoff frequency f2 in the non-insertion region 54 is positioned around the frequency fr. Thus, the lateral mode acoustic wave propagating through the resonance region 50 is able to propagate through the non-insertion region 54. Accordingly, a boundary 62 between the resonance region 50 and the non-insertion region 54 becomes a free end. Since the lateral mode acoustic wave is not able to propagate through the insertion region 56, a boundary 64 between the non-insertion region 54 and the insertion region 56 becomes a fixed end.

As illustrated in FIG. 19B through FIG. 19E, the boundary 62 becomes an antinode of the standing wave, and the boundary 64 becomes a node of the standing wave. In any of the first mode through the fourth mode, the sum of the areas 80a of positive electrical signals of the standing wave in the resonance region 50 is equal to the sum of the areas 80b of negative electrical signals of the standing wave in the resonance region 50. Thus, spurious does not occur.

As described above, spurious is reduced by providing the non-insertion region 54 having no insertion film 28 located therein so as to surround the resonance region 50.

As described above, in the first embodiment and the variations thereof, the lower additional film 13 (a mass load film) is separated from the lower electrode 12 in at least a part of the region surrounding the resonance region 50 in plan view and is located under the piezoelectric film 14, and/or the upper additional film 17 (a mass load film) is separated from the upper electrode 16 in at least a part of the region surrounding the resonance region 50 in plan view and is located on the piezoelectric film 14. That is, the upper additional film 17 is located at a first side, which is closer to the upper electrode 16, of the piezoelectric film 14, is separated from the upper electrode 16, and surrounds in plan view the resonance region 50 at least in part, and/or the lower additional film 13 is located at a second side, which is closer to the lower electrode 12, of the piezoelectric film 14, is separated from the lower electrode 12, and surrounds in plan view the resonance region 50 at least in part. The air gap 30 includes the resonance region 50 and the lower additional film 13 and the upper additional film 17 in plan view. This structure allows the lower additional film 13 and/or the upper additional film 17 to inhibit the lateral mode acoustic wave from leaking from the resonance region 50. Therefore, the resonance characteristics, including a Q-value, are improved.

As the mass load film, only the upper additional film 17 located on the piezoelectric film 14 may be provided. Alternatively, only the lower additional film 13 located under the piezoelectric film 14 may be provided. Yet alternatively, the upper additional film 17 located on the piezoelectric film 14 and the lower additional film 13 located under the piezoelectric film 14 may be provided.

As illustrated in FIG. 2A and FIG. 2B, the upper additional film 17 and the lower additional film 13 are preferably located in practically the entire region surrounding the resonance region 50 in plan view.

The width W58 of the separation region 58 is preferably small to the extent that the acoustic wave is able to propagate. For example, the width W58 is preferably equal to or less than the wavelength of the acoustic wave propagating through the resonance region 50 in the lateral direction. The width W58 is preferably 1 µm or less, more preferably 0.5 µm or less.

To reflect the acoustic wave in the additional film region 52, the weight per unit area of the upper additional film 17 is preferably substantially equal to the weight per unit area of the upper electrode 16 to the extent of manufacturing error, and the weight per unit area of the lower additional film 13 is preferably substantially equal to the weight per unit area of the lower electrode 12 to the extent of manufacturing error. For example, as illustrated in FIG. 3A through FIG. 3C, the lower electrode 12 and the lower additional film 13 are simultaneously formed. This process makes the materials and the film thicknesses of the lower electrode 12 and the lower additional film 13 virtually the same. The upper electrode 16 and the upper additional film 17 are simultaneously formed. This process makes the materials and the film thicknesses of the upper electrode 16 and the upper additional film 17 virtually the same. That is, the upper additional film 17 and/or the lower additional film 13 are made of the same metal material as the upper electrode 16 and/or the lower electrode 12, respectively.

The upper additional film 17 and/or the lower additional film 13 may be separated from the upper electrode 16 and/or the lower electrode 12 across an air gap (the air layer 22) or the insulating film 24.

The insertion film 28 is located further out than the resonance region 50 in at least a part of the region surrounding the resonance region 50, is not located in the resonance region 50, and is inserted between the lower electrode 12 and the upper electrode 16. Thus, the Q-value and the electromechanical coupling coefficient are improved as with the samples B and C.

Additionally, as in the samples B and C, the insertion film 28 overlaps with at least a part of at least one of the upper additional film 17 and the lower additional film 13 in plan view. This structure improves the Q-value and the electromechanical coupling coefficient.

In plan view, the insertion film 28 does not overlap with the non-insertion region 54 (a first region), which is closer to the resonance region 50, within the upper additional film 17 and/or the lower additional film 13, and overlaps with the insertion region 56 (a second region), which is opposite from the resonance region 50, within the upper additional film 17 and/or the lower additional film 13. This structure reduces spurious as with the sample C.

The insertion film 28 may be located in the separation region 58, or may not be necessarily located in the separation region 58. The insertion film 28 may be located in a part of the separation region 58.

Desirable values for the widths W54, W56 and W58 of the non-insertion region 54, the insertion region 56 and the separation region 58 will be examined. In the above simulation, the total thickness H of the lower electrode 12, the piezoelectric film 14, and the upper electrode 16 in the resonance region 50 is 1.74 µm. Thus, the wavelength $\lambda 1$ of the longitudinal acoustic wave in the resonance region 50 is $2 \times H = 3.58$ µm.

Figure 19E:
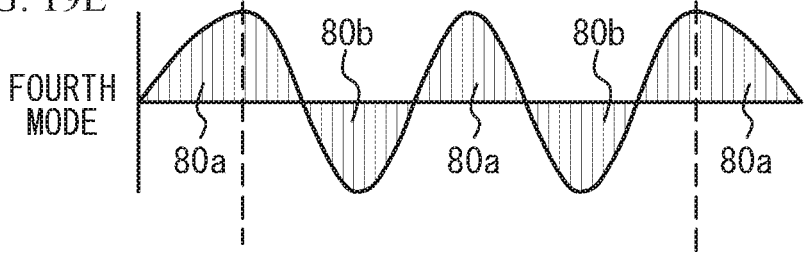

As illustrated in FIG. 19A and FIG. 19E, to make the boundary 62 the antinode of the acoustic wave and the boundary 64 the node of the acoustic wave, the width W54 of the non-insertion region 54 is preferably $(2n-1)/4$ times the wavelength $\lambda 2$ of the acoustic wave propagating in the lateral direction (n is a natural number). As clear from FIG. 17, the range in which spurious is reduced in the non-insertion region 54 is from the resonant frequency fr to the frequency f02 corresponding to the bottom of the dispersion curve in the non-insertion region 54. The wave number in the non-insertion region 54 within the range is between $\beta 2a$ and $\beta 2b$. $\beta 2a$ and $\beta 2b$ are respectively approximately 0.38 $\mu m^{-1}$ and approximately 1.0 $\mu m^{-1}$. Thus, the center wave number $\beta 2$ of the range is assumed to be approximately 0.6 $\mu m^{-1}$. In this case, the wavelength $\lambda 2$ of the wave number $\beta 2$ is $2 \times \pi / \beta 2 \approx 10.5$ µm. The relation between $\lambda 1$ and $\lambda 2$ is $\lambda 2 \approx 3 \times \lambda 1$. Thus, the width W54 of the non-insertion region 54 is preferably around $(2n-1)/4' 3\lambda 1$ (n is a natural number). To minimize the width W54 to reduce the size, the width W54 is preferably $1/4 \cdot 3 \lambda 2 \approx 3/4 \times \lambda 1 = 3/2 \times H$. The range is preferably $1/8 \times \lambda 2 \leq W54 \leq 3/8 \times \lambda 2$, i.e., $3/4 \times H \leq W54 \leq 9/4 \times H$, more preferably $H \leq W54 \leq 2 \times H$.

To efficiently reflect the acoustic wave in the insertion region 56, the width W56 of the insertion region 56 is preferably $(2n)/4$ times the wavelength $\lambda 3$ of the acoustic wave propagating in the lateral direction (n is a natural number). Based on FIG. 17, the improvement of the Q-value at the antiresonant frequency fa is considered. The wave number $\beta 3$ at the antiresonant frequency fa in the insertion region 56 is approximately 1.8 $\mu m^{-1}$. The wavelength $\lambda 3$ of the wave number $\beta 3$ is $2 \times \pi / \beta 3 \approx 3.4$ µm. The relation between $\lambda 1$ and $\lambda 3$ is $\lambda 3 \approx \lambda 1$. Thus, the width W56 of the insertion region 56 is preferably around $(2n)/4 \times \lambda 1$ (n is a natural number). To minimize the width W56 to reduce the size, the width W5 is preferably $1/2 \times \lambda 3 \approx 1/2 \times 1 = H$. The range is preferably $3/8 \times \lambda 3 \leq W56 \leq 5/8 \times \lambda 3$, i.e., $3/4 \times H \leq W56 \leq 5/4 \times H$, more preferably $7/8 \times H \leq W56 \leq 9/8 \times H$.

To reduce spurious in the non-insertion region 54, the width W58 of the separation region 58 is preferably small to the extent that the acoustic wave of the wavelength $\lambda 2$ passes through the separation region 58. When the width W58 is $1/16 \times \lambda 2$ or less, the acoustic wave mostly passes through the separation region 58, and when the width W58 is $1/32 \times \lambda$ or less, the acoustic wave passes through the separation region 58 more. Thus, the width W58 is preferably $3/8 \times H$ or less, more preferably $3/16 \times H$ or less.

Second Embodiment

Figure 20A:
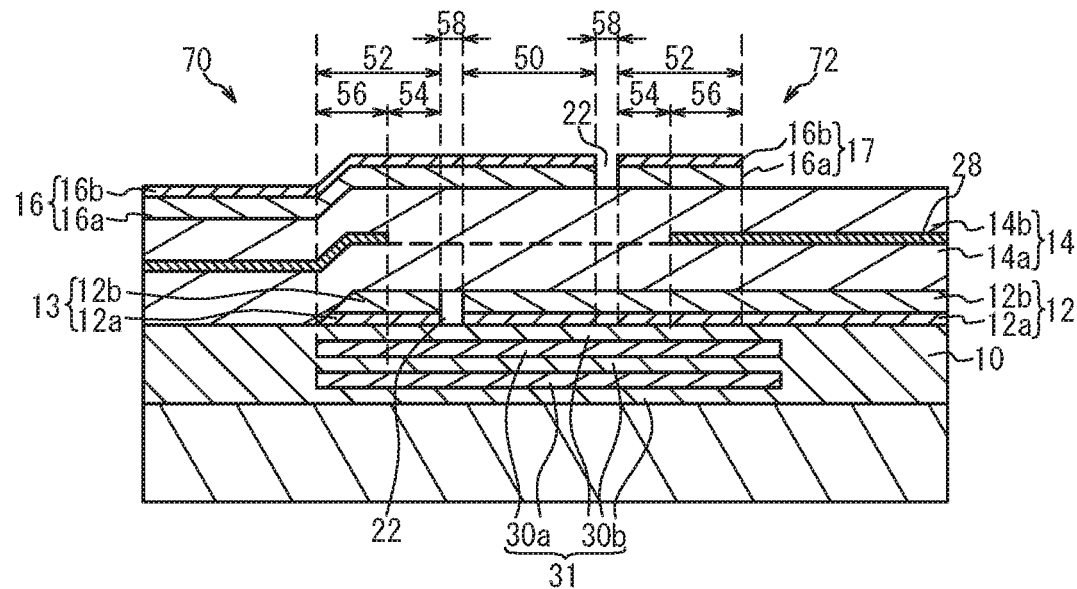
FIG. 20A and FIG. 20B are cross-sectional views of piezoelectric thin film resonators in accordance with a second embodiment.
Figure 20B:
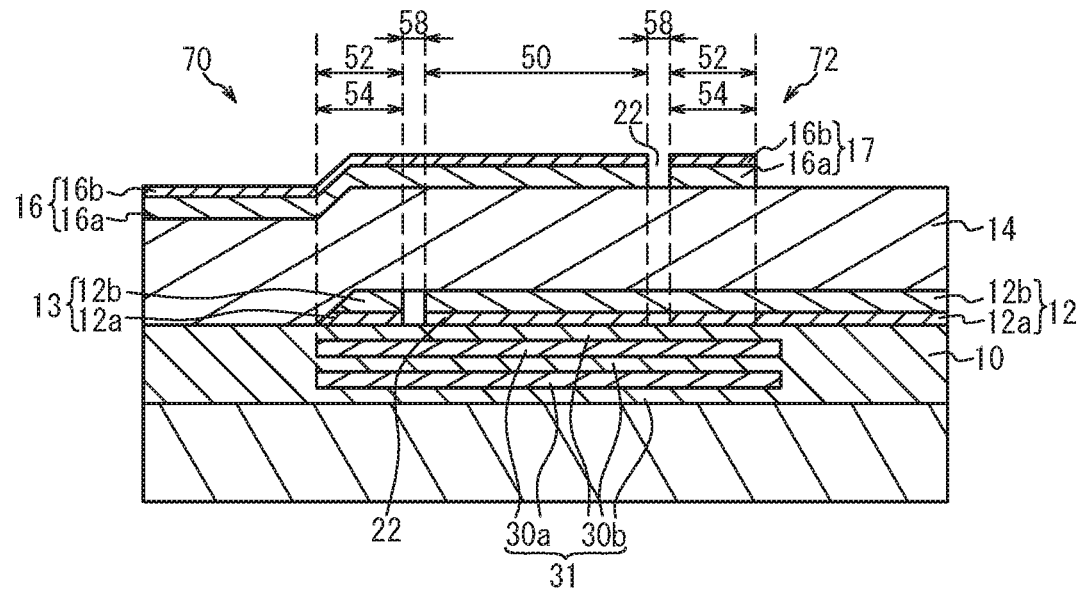

A second embodiment changes the structure of the air gap. FIG. 20A and FIG. 20B are cross-sectional views of a piezoelectric thin film resonator in accordance with the second embodiment. As illustrated in FIG. 20A and FIG. 20B, a recess is formed on the upper surface of the substrate 10. The lower electrode 12 and the lower additional film 13 are flatly formed on the substrate 10. Accordingly, the air gap 30 is formed in the recess of the substrate 10. The air gap 30 is formed so as to include the resonance region 50. Other structures are the same as those of the first embodiment and the third variation thereof, and the description thereof is thus omitted. The air gap 30 may be formed so as to penetrate through the substrate 10.

First Variation of the Second Embodiment

Figure 21A:
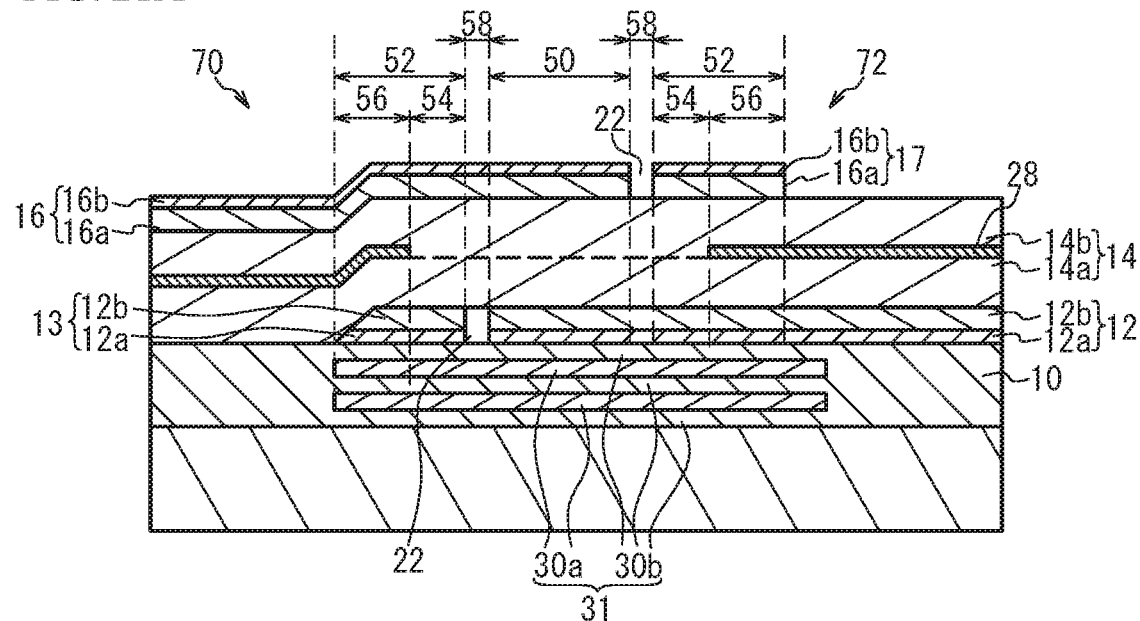
FIG. 21A and FIG. 21B are cross-sectional views of piezoelectric thin film resonators in accordance with a first variation of the second embodiment.
Figure 21B:
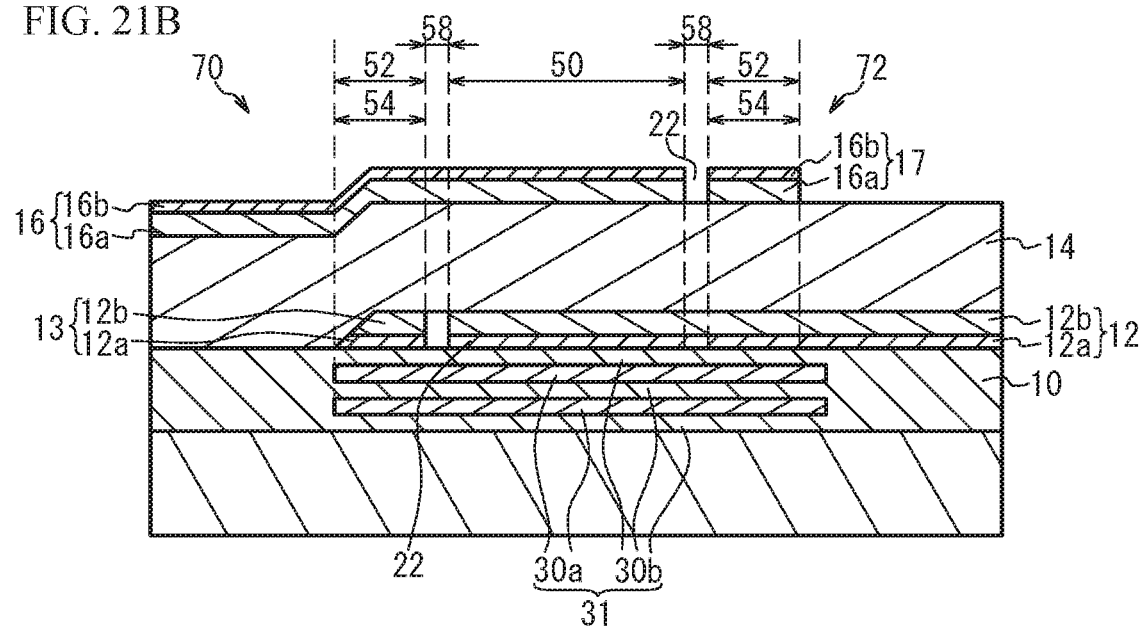

FIG. 21A and FIG. 21B are cross-sectional views of piezoelectric thin film resonators in accordance with a first variation of the second embodiment. As illustrated in FIG. 21A and FIG. 21B, an acoustic mirror 31 is formed under the lower electrode 12 in the resonance region 50. The acoustic mirror 31 is formed of films 30a with low acoustic impedance and films 30b with high acoustic impedance alternately stacked. The film thickness of each of the films 30a and 30b is, for example, $\lambda/4$ ($\lambda$ is the wavelength of the acoustic wave). The number of the films 30a and the films 30b to be stacked is freely selected. It is sufficient if the acoustic mirror 31 includes at least two layers with different acoustic characteristics stacked at an interval. Alternatively, the substrate 10 may be one of at least two layers with different acoustic characteristics of the acoustic mirror 31. For example, the acoustic mirror 31 may have a structure in which a single layer of a film with acoustic impedance different from that of the substrate 10 is located in the substrate 10. Other structures are the same as those of the first embodiment and the third variation thereof, and the description thereof is thus omitted.

In the first embodiment and the variations thereof, the air gap 30 may be formed in the same manner as the second embodiment, or as in the first variation of the second embodiment, the acoustic mirror 31 may be formed instead of the air gap 30.

As in the first embodiment and the variations thereof and the second embodiment, the piezoelectric thin film resonator may be a Film Bulk Acoustic Resonator (FBAR) in which the air gap 30 is formed between the substrate 10 and the lower electrode 12 in the resonance region 50. Alternatively, as in the first variation of the second embodiment, the piezoelectric thin film resonator may be a Solidly Mounted Resonator (SMR) including the acoustic mirror 31 that reflects the acoustic wave propagating through the piezoelectric film 14 under the lower electrode 12 in the resonance region 50. It is sufficient if an acoustic reflection layer including the resonance region 50 and the additional film region 52 includes the air gap 30 or the acoustic mirror 31.

In the first and second embodiments and the variations thereof, the insertion film 28 is provided so as to surround the entire of the resonance region 50, but it is sufficient if the insertion film 28 is located further out than the resonance region 50 in at least a part of the region surrounding the resonance region 50. For example, the regions 52 and 54 may have a partly cut ring-shape. The example in which the insertion film 28 is inserted in the piezoelectric film 14 has been described, but the insertion film 28 may be inserted between the lower electrode 12 and the lower additional film 13 and the piezoelectric film 14. The insertion film 28 may be inserted between the piezoelectric film 14 and the upper electrode 16 and the upper additional film 17. An elliptical shape has been described as an example of the planar shape of the resonance region 50, but the planar shape of the resonance region 50 may be a polygonal shape such as a quadrangle shape or a pentagonal shape.

Third Embodiment

Figure 22A:
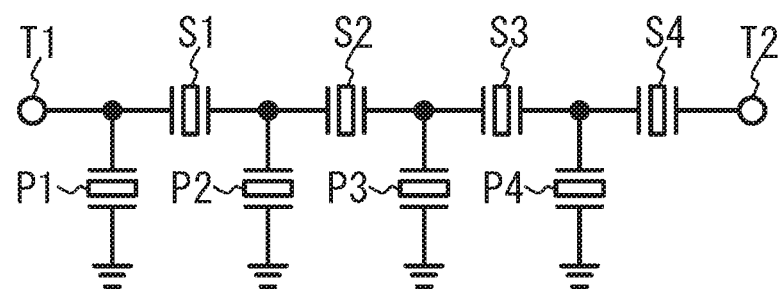
FIG. 22A is a circuit diagram of a filter in accordance with a third embodiment.

A third embodiment is an exemplary filter and an exemplary duplexer including the piezoelectric thin film resonator according to any one of the first and second embodiments and the variations thereof. FIG. 22A is a circuit diagram of a filter in accordance with the third embodiment. As illustrated in FIG. 22A, between an input terminal T1 and an output terminal T2, one or more series resonators S1 through S4 are connected in series. Between the input terminal T1 and the output terminal T2, one or more parallel resonators P1 through P4 are connected in parallel. At least one of one or more series resonators S1 through S4 and one or more parallel resonators P1 through P4 may be the piezoelectric thin film resonator according to any one of the first and second embodiments and the variations thereof. The number of resonators in the ladder-type filter can be appropriately set.

Figure 22B:
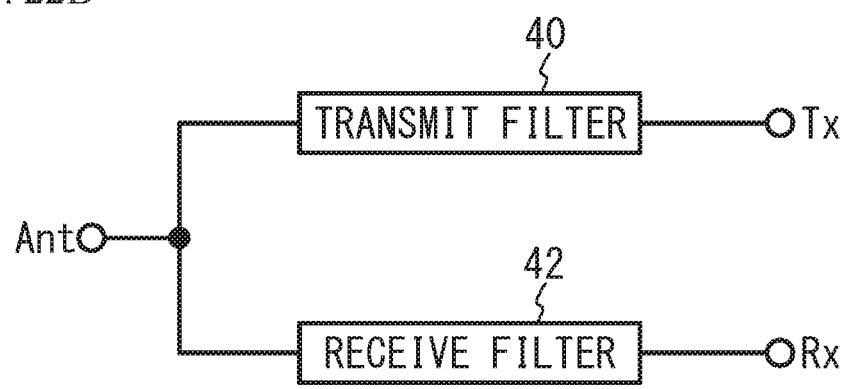
FIG. 22B is a circuit diagram of a duplexer in accordance with a variation of the third embodiment.

FIG. 22B is a circuit diagram of a duplexer in accordance with a variation of the third embodiment. As illustrated in FIG. 22B, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. At least one of the transmit filter 40 and the receive filter 42 may be the filter of the third embodiment.

The filter includes the piezoelectric thin film resonator according to any one of the first and second embodiments and the variations thereof. Thus, the Q-value of the resonator is improved, and thereby the skirt characteristic of the filter is improved.

At least one of the transmit filter 40 and the receive filter 42 may be the filter including the piezoelectric thin film resonator according to any one of the first and second embodiments and the variations thereof.

Although the embodiments of the present invention have been described in detail, it is to be understood that the various change, substitutions, and alterations could be made hereto without departing from the spirit and scope of the invention.

What is claimed is:
1. A piezoelectric thin film resonator comprising:
a substrate;
a piezoelectric film located on the substrate;
a lower electrode and an upper electrode facing each other across at least a part of the piezoelectric film;
a mass load film that is located at at least one of a first side, which is closer to the upper electrode, of the piezoelectric film and a second side, which is closer to the lower electrode, of the piezoelectric film, is separated from the upper electrode and the lower electrode, and surrounds in plan view a resonance region at least in part, the lower electrode and the upper electrode facing each other across the piezoelectric film in the resonance region; and
an acoustic reflection layer that includes the resonance region and the mass load film in plan view, is located in or on the substrate, and includes an air gap or an acoustic mirror in which at least two layers with different acoustic characteristics are stacked, wherein
a separation width between the mass load film and the resonance region is equal to or less than 3/8 times a total thickness of the lower electrode, the piezoelectric film, and the upper electrode.

2. The piezoelectric thin film resonator according to claim 1, wherein
the mass load film is located under the piezoelectric film.

3. The piezoelectric thin film resonator according to claim 1, wherein
the mass load film is located on and under the piezoelectric film.

4. The piezoelectric thin film resonator according to claim 1, wherein
an electric potential of the mass load film is a floating electric potential.

5. The piezoelectric thin film resonator according to claim 1, wherein
the mass load film located at the first side of the piezoelectric film is made of a metal material identical to a metal material of the upper electrode, and the mass load film located at the second side of the piezoelectric film is made of a metal material identical to a metal material of the lower electrode.

6. The piezoelectric thin film resonator according to claim 1, wherein
the mass load film located at the first side of the piezoelectric film is separated from the upper electrode across another air gap, and the mass load film located at the second side of the piezoelectric film is separated from the lower electrode across yet another air gap.

7. A filter comprising:
a piezoelectric thin film resonator according to claim 1.

8. A multiplexer comprising:
a filter according to claim 7.

9. A piezoelectric thin film resonator comprising:
a substrate;
a piezoelectric film located on the substrate;
a lower electrode and an upper electrode facing each other across at least a part of the piezoelectric film;
a mass load film that is located at at least one of a first side, which is closer to the upper electrode, of the piezoelectric film and a second side, which is closer to the lower electrode, of the piezoelectric film, is separated from the upper electrode and the lower electrode, and surrounds in plan view a resonance region at least in part, the lower electrode and the upper electrode facing each other across the piezoelectric film in the resonance region; and
an acoustic reflection layer that includes the resonance region and the mass load film in plan view, is located in or on the substrate, and includes an air gap or an acoustic mirror in which at least two layers with different acoustic characteristics are stacked, wherein
a weight per unit area of the mass load film located at the first side of the piezoelectric film is approximately equal to a weight per unit area of the upper electrode, and a weight per unit area of the mass load film located at the second side of the piezoelectric film is approximately equal to a weight per unit area of the lower electrode.

10. A filter comprising:
a piezoelectric thin film resonator according to claim 9.

11. A multiplexer comprising:
a filter according to claim 10.

12. A piezoelectric thin film resonator comprising:
a substrate;
a piezoelectric film located on the substrate;
a lower electrode and an upper electrode facing each other across at least a part of the piezoelectric film;
a mass load film that is located at at least one of a first side, which is closer to the upper electrode, of the piezoelectric film and a second side, which is closer to the lower electrode, of the piezoelectric film, is separated from the upper electrode and the lower electrode, and surrounds in plan view a resonance region at least in part, the lower electrode and the upper electrode facing each other across the piezoelectric film in the resonance region; and
an acoustic reflection layer that includes the resonance region and the mass load film in plan view, is located in or on the substrate, and includes an air gap or an acoustic mirror in which at least two layers with different acoustic characteristics are stacked,
an insertion film that is located further out than the resonance region in at least a part of a region surrounding the resonance region, is not located in the resonance region, and is inserted between the lower electrode and the upper electrode.

13. The piezoelectric thin film resonator according to claim 12, wherein
the insertion film overlaps with at least a part of the mass load film in plan view.

14. The piezoelectric thin film resonator according to claim 12, wherein
a separation width between the mass load film and the resonance region is equal to or less than 3/8 times a total thickness of the lower electrode, the piezoelectric film, and the upper electrode.

15. The piezoelectric thin film resonator according to claim 12, wherein
in plan view, the insertion film does not overlap with a first region, which is closer to the resonance region, within the mass load film, and overlaps with a second region, which is further away from the resonance region than the first region, within the mass load film.

16. The piezoelectric thin film resonator according to claim 15, wherein
a width of the first region, with which the insertion film does not overlap, within the mass load film is equal to or greater than 3/4 times and equal to or less than 9/4 times the total thickness of the lower electrode, the piezoelectric film, and the upper electrode.

17. A filter comprising:
a piezoelectric thin film resonator according to claim 12.

18. A multiplexer comprising:
a filter according to claim 17.

* * * * *